(12) United States Patent
Farhangdoust et al.

(10) Patent No.: US 12,101,041 B2
(45) Date of Patent: *Sep. 24, 2024

(54) SELF-POWERED SENSOR NODES FOR STRUCTURAL HEALTH MONITORING

(71) Applicant: The Boeing Company, Chicago, IL (US)

(72) Inventors: Saman Farhangdoust, Miami, FL (US); Gary E. Georgeson, Tacoma, WA (US); Jeong-Beom Ihn, Bellevue, WA (US)

(73) Assignee: The Boeing Company, Arlington, VA (US)

( * ) Notice: Subject to any disclaimer, the term of this patent is extended or adjusted under 35 U.S.C. 154(b) by 545 days.

This patent is subject to a terminal disclaimer.

(21) Appl. No.: 17/334,845

(22) Filed: May 31, 2021

(65) Prior Publication Data

US 2021/0399658 A1 Dec. 23, 2021

Related U.S. Application Data

(63) Continuation-in-part of application No. 16/907,192, filed on Jun. 20, 2020, now Pat. No. 11,700,773.

(51) Int. Cl.
*H02J 9/06* (2006.01)
*B64D 45/00* (2006.01)
(Continued)

(52) U.S. Cl.
CPC ............. *H02N 2/186* (2013.01); *B64D 45/00* (2013.01); *H01Q 15/0086* (2013.01); *H02N 2/181* (2013.01); *B64D 2045/0085* (2013.01)

(58) Field of Classification Search
CPC .... H02N 2/186; H02N 2/181; H01Q 15/0086; B64D 45/00; B64D 2045/0085; G01N 2291/2694; G01N 29/04; G01N 29/14; G01N 29/223; G01N 29/2437; G01N 29/2481; H10N 30/304; H10N 30/306;
(Continued)

(56) References Cited

U.S. PATENT DOCUMENTS 8,032,486 B2 * 10/2011 Townsend .......... G08B 21/0453
  707/602
10,243,136 B2 * 3/2019 Ghanbari ............... H02N 2/186
(Continued)

*Primary Examiner* — Elim Ortiz
(74) *Attorney, Agent, or Firm* — Ostrager Chong Flaherty & Broitman P.C.

(57) ABSTRACT

A self-powered sensor node includes a printed wiring board connected to a patch. The printed wiring board includes a microcontroller, a transceiver, an antenna, and a power management module connected to supply electric power to the microcontroller. The patch comprises a metamaterial substrate and a piezoelectric element adhered to the metamaterial substrate. The piezoelectric element is connected to the power management module and to the microcontroller. The power management module is configured to store electric power received from the piezoelectric element. The microcontroller is configured to selectively convert electrical signals received from the piezoelectric element into sensor data and then command the transceiver to transmit the sensor data via the antenna. The metamaterial substrate has an auxetic kirigami honeycomb structure.

20 Claims, 27 Drawing Sheets

(51) Int. Cl.
*H01Q 15/00* (2006.01)
*H02N 2/18* (2006.01)

(58) Field of Classification Search
CPC .... H10N 30/302; Y02T 50/50; G01M 5/0066; H02J 2207/50; H02J 2310/44; H02J 50/001; H02J 50/005; H02J 7/0042
See application file for complete search history.

(56) References Cited

U.S. PATENT DOCUMENTS

| | | | |
|---|---|---|---|
| 11,433,633 B2 * | 9/2022 | Calisch | F21V 1/18 |
| 2009/0219139 A1 * | 9/2009 | Slesinski | G06K 19/0723 |
| | | | 340/10.1 |

* cited by examiner

SELF-POWERED SENSOR NODES FOR STRUCTURAL HEALTH MONITORING

RELATED PATENT APPLICATION

This application is a continuation-in-part of and claims priority from U.S. patent application Ser. No. 16/907,192 filed on Jun. 20, 2020, which issued as U.S. Pat. No. 11,700,773 on Jul. 11, 2023.

BACKGROUND

The field of the following disclosure relates generally to structural health monitoring, and, more particularly, relates to methods and systems for aircraft structural health monitoring.

In order to reduce the high cost of aircraft structure maintenance (including disassembly, inspection, and re-assembly), structural health monitoring (SHM) is being developed. Some piezoelectric sensor and comparative vacuum monitoring systems have been applied to limited-access locations where damage initiation and growth can occur. A wireless sensor network (WSN) typically includes a plurality of sensor nodes. Each sensor node possesses computing power and the ability to transmit and receive messages wirelessly. In a typical implementation, each sensor node comprises one or more sensors, a processing unit (e.g., a microcontroller), a transceiver, and an energy source.

One example SHM system is formed using a plurality of piezoelectric transducers acoustically coupled to a structure. Each piezoelectric transducer, acting one at a time, broadcasts a vibration signal and all other piezoelectric transducers record the signal as received at their respective locations. Such interrogation is performed when the structure is in a known healthy state and the received signals are recorded and saved as reference signals. At some future time (e.g., after the structure has been in service for a period of time), the structure is interrogated again and newly acquired signals (hereinafter "test signals") are compared to the reference signals. Any differences found between reference signals and test signals may indicate damage in the structure and/or correlate to the magnitude of damage to the structure. The differences between the reference and test signals are generally reduced to a single number called a damage index (DI), with larger values indicating more damage.

Typical piezoelectric sensor-based networked SHM systems include data cables, batteries, power cables, etc. that add weight and maintenance factors to the system. However, SHM systems that require access to AC power from a centrally located power source or DC power supplied by heavy batteries are difficult to apply to aircraft. The cabling often needs to be routed to a sensor node located in a limited-access area, adding more length and weight. Battery replacement adds another maintenance step, which may also require structural disassembly.

Self-powered WSNs using energy harvesting have been developed to solve the low reliability of data cables, the finite life span of batteries, the difficulties of battery replacement, and the high maintenance cost of power cables in SHM systems. However, current energy harvesting systems do not supply enough power to enable the most important actions related to SHM. There is a need to harvest and store ambient energy in order to make the sensor nodes of SHM systems autonomous from an energy standpoint while at the same time increasing sensor sensitivity.

SUMMARY

The subject matter disclosed in some detail below is directed to systems and methods for structural health monitoring using self-powered sensor nodes. The sensor nodes include enhanced piezoelectric transducers in the form of patches that may be adhered to the surface of or embedded in the host structure to be monitored. Each patch comprises a piezoelectric element and a substrate made of metamaterial (hereinafter "meta-substrate"), which are glued together and then attached to the host structure. The meta-substrate is designed to enhance the efficiency (in an energy harvesting mode) and sensitivity (in a sensing mode) of the piezoelectric transducer.

In accordance with one embodiment, the meta-substrate is designed with mechanical properties that increase the transfer of vibrational energy from a vibration source to the piezoelectric element. Such a meta-substrate may be incorporated in a piezoelectric transducer to increase electric power output for energy harvesting applications. As used herein, the term "meta-substrate piezoelectric transducer" means a piezoelectric transducer that includes a meta-substrate glued to a piezoelectric element. The meta-substrate piezoelectric transducer converts the vibration energy to electric current, which current may be used to provide electric power to an energy buffer (e.g., a capacitor) for real-time monitoring or to a supercapacitor for periodic monitoring. The meta-substrate piezoelectric transducer also has improved sensitivity for guided wave sensing applications.

In accordance with one proposed implementation, the meta-substrate combines two metamaterial-based topologies: kirigami and auxetic. The meta-substrate adds the negative Poisson's ratio capability to the kirigami substrate. A meta-substrate piezoelectric transducer of the type disclosed herein has enhanced multi-directional expansion with an adequate deformation compared to conventional piezoelectric transducers. The meta-substrate enhances the mechanical properties/behaviors of the piezoelectric transducer by the interplay between materials and specially designed geometries. The meta-substrate stretches the piezoelectric element in two directions at once due to its auxetic negative Poisson's ratio. The meta-substrate is more stretchable than a plain substrate (as used herein, the term "plain substrate" means a substrate made of a structure having a positive Poisson's ratio) and has enhanced strain capacity owing to its kirigami cuts, which boost the stress concentrations in the piezoelectric element. The creative design of the meta-substrate can improve strain-induced vibration in applications wherein energy efficiency is dependent on deformation performance. The mechanical properties of the meta-substrate increase the tensile deformation capacity and energy conversion efficiency of the piezoelectric transducer.

In accordance with one embodiment, the meta-substrate piezoelectric transducer proposed herein includes a meta-substrate consisting of one or more cells having an auxetic frame with two kirigami cuts, a piezoelectric element, and a thin layer of elastic glue that bonds the piezoelectric element to the meta-substrate. As used herein, the term "elastic glue" means glue that is able to undergo high strains without adhesive or cohesive failure, such as epoxy or silicone. The power output of a piezoelectric element glued to the meta-substrate disclosed herein is many times greater than the power produced by a piezoelectric element adhered to a plain substrate.

The design of the meta-substrate combines kirigami and auxetic topologies to create a high-performance platform that includes preferable mechanical properties of both meta-material morphable structures. The creative design of the meta-substrate can improve strain-induced vibration applications in structural health monitoring (SHM) systems, internet-of-things (IoT) systems, micro-electromechanical systems, wireless sensor networks (WSNs), vibration energy harvesters, and other applications where energy efficiency is dependent on deformation performance.

The meta-substrate piezoelectric transducers disclosed herein may be strategically placed on an aircraft, thereby limiting disassembly time and costs associated with other inspection schemes. In one proposed implementation, energy-harvesting transducers are installed at locations that are optimum for energy harvesting while sensing transducers are installed in limited-access areas to be monitored. A sustainable system is enabled that uses high-efficiency energy harvesting combined with remote piezoelectric sensing on an aircraft. The resulting increase in power enables an increased data gathering capability, greater wireless transmission distances, the employment of more sensors, greater area coverage, fuller data monitoring, and increased decision-making speed.

Although various embodiments of SHM systems having self-powered sensor nodes with meta-substrate-based piezoelectric transducers are described in some detail below, one or more of those embodiments may be characterized by one or more of the following aspects.

One aspect of the subject matter disclosed in detail below is a self-powered sensor node comprising: a printed wiring board comprising a microcontroller, a transceiver connected to communicate with the microcontroller, an antenna connected to the transceiver, and a power management module connected to supply electric power to the microcontroller; and a patch comprising a metamaterial substrate and a piezoelectric element adhered to the metamaterial substrate. The piezoelectric element is connected to the power management module and to the microcontroller. The power management module is configured to store electric power received from the piezoelectric element. The microcontroller is configured to selectively convert electrical signals received from the piezoelectric element into sensor data and then command the transceiver to transmit the sensor data via the antenna. The metamaterial substrate has an auxetic kirigami honeycomb structure.

Another aspect of the subject matter disclosed in detail below is a self-powered sensor node comprising: a printed wiring board comprising a microcontroller, a transceiver connected to communicate with the microcontroller, an antenna connected to the transceiver, and a power management module connected to supply electric power to the microcontroller; a first patch comprising a first metamaterial substrate and a first piezoelectric element adhered to the first metamaterial substrate and connected to the power management module; and a second patch comprising a second metamaterial substrate and a second piezoelectric element adhered to the second metamaterial substrate and connected to the microcontroller. The power management module is configured to store electric power received from the first piezoelectric element. The microcontroller is configured to selectively convert electrical signals received from the second piezoelectric element into sensor data and then command the transceiver to transmit the sensor data via the antenna. The first and second metamaterial substrates each have an auxetic kirigami honeycomb structure.

A further aspect of the subject matter disclosed in detail below is a method for operating a sensor node attached to a host structure, the method comprising: (a) coupling a metamaterial substrate to a host structure that has vibrational modes; (b) coupling a piezoelectric element to the metamaterial substrate; (c) attaching a printed wiring board to a surface of the host structure; (d) connecting the piezoelectric element to a power management module onboard the printed wiring board; (e) connecting the piezoelectric element to a microcontroller onboard the printed wiring board; (f) converting ambient vibrations within the host structure into electric power using the piezoelectric element; (g) storing electric power from the piezoelectric element in an energy buffer of the power management module; (h) supplying power to the microcontroller from the energy buffer; and (i) enabling selective communication between the microcontroller and the piezoelectric element. The metamaterial substrate has an auxetic kirigami honeycomb structure.

In accordance with one embodiment of the method described in the immediately preceding paragraph, the selective communication is electrical current representing an activation waveform sent from the microcontroller to the piezoelectric element. In accordance with another embodiment, the selective communication is electrical current transduced from mechanical waves by the piezoelectric element and received by the microcontroller.

Other aspects of SHM systems having self-powered sensor nodes with meta-substrate-based piezoelectric transducers are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

Figure 1:
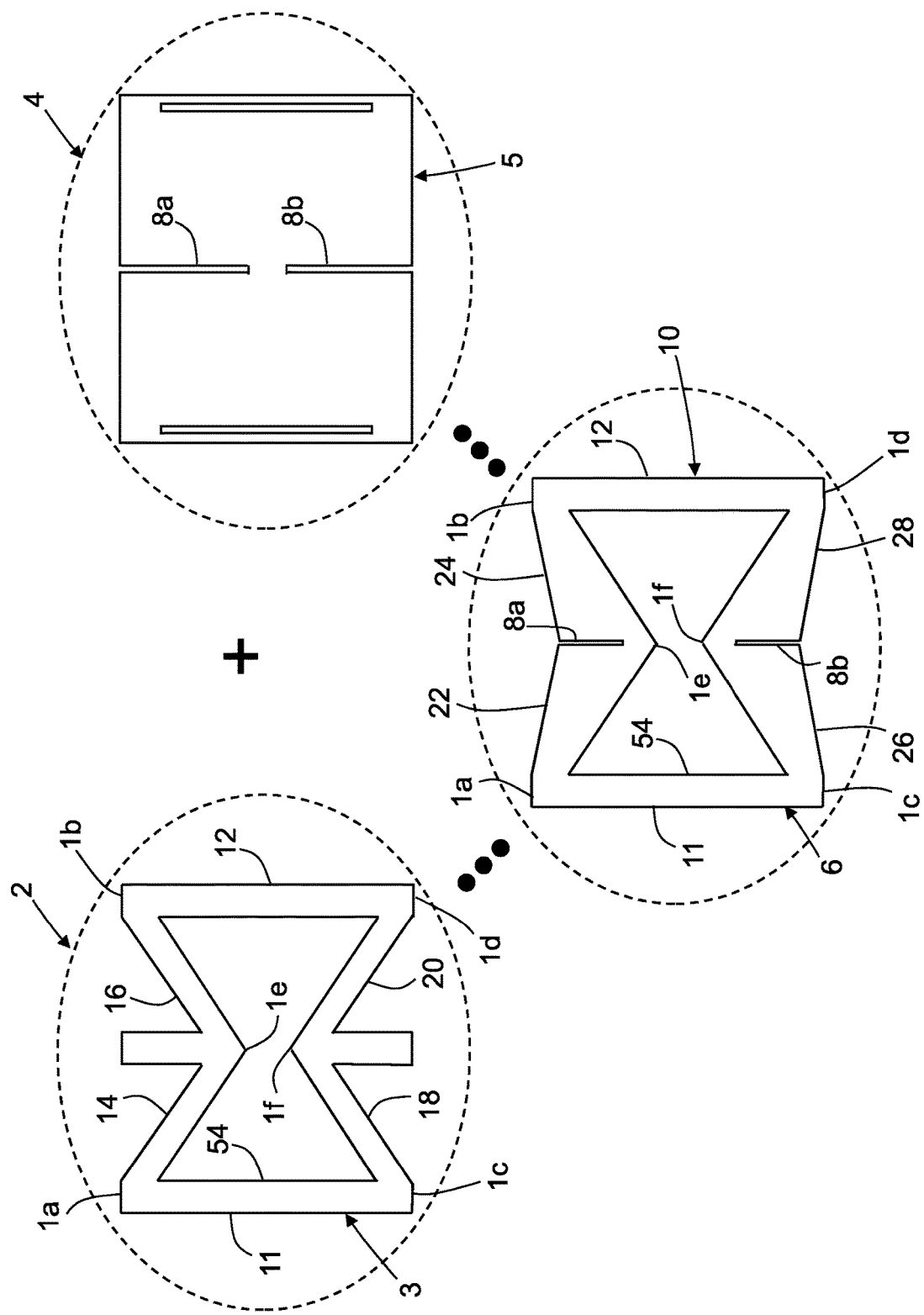
FIG. 1 is a diagram showing the concept of combining two different metamaterial-based topologies—kirigami and auxetic—to construct a meta-substrate suitable for boosting the efficiency of a piezoelectric energy harvester.

For the purpose of illustration, various embodiments of SHM systems having self-powered sensor nodes with meta-substrate-based piezoelectric transducers will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

A piezoelectric energy harvester is able to harness strain energy of structures exposed to cyclic strains in which the vibration strain is the most abundant energy source. More specifically, a pair of oppositely polarized piezoelectric wafers deflect to produce an electrical current. Also a strain piezoelectric energy harvester does not need tuning techniques or inertia effects of any external mass for exacerbating the oscillation. However, low efficiency is the severe limitation for piezoelectric energy harvesters, especially for devices with a low-amplitude low-frequency excitation.

The efficiency of a piezoelectric energy harvester may be enhanced by applying the piezoelectric element on a substrate made of metamaterial. A metamaterial is a material engineered to have a property that is not found in naturally occurring materials. The materials are usually arranged in repeating patterns of micro scale elements. Metamaterials derive their properties not from the properties of the base materials, but from their newly designed structures.

Auxetic materials have been used to enhance the efficiency of piezoelectric energy harvesters. Auxetic materials display a negative Poisson's ratio. The Poisson's ratio defines the ratio between two characteristics of lateral and axial strains of a structure. The value of Poisson's ratio is the negative of the ratio of lateral (transverse) strain to axial strain:

$$\vartheta = -\frac{\varepsilon_{lateral}}{\varepsilon_{axial}}$$

Typically, materials have positive Poisson's ratio and contract in the orthogonal direction of applied force. However, this reaction is completely different for auxetic structures that exhibit counterintuitive behavior during deformation. The negative Poisson's ratio of the auxetic design enables structures to be expanded in both longitudinal and transverse directions easily. In recent years, in light of the success in power output enhancement based on materials having negative Poisson's ratio, the auxetic types of energy harvesters have gradually attracted attention.

Kirigami is another metamaterial that has been employed in energy harvesters. The kirigami metamaterial has been developed based on incised periodic and symmetric cuts which are applied to shells and plates to enrich the breaking strain and deformation capacity of the material. One team of investigators proved experimentally that a soft and highly deformable piezoelectric energy harvester with a kirigami-based substrate produced a 2.6 times improvement in voltage output compared to conventional piezoelectric energy harvesters.

The energy efficiency of piezoelectric energy harvesters may be enhanced by incorporation of a metamaterial-based substrate having preferred mechanical properties. The meta-substrates disclosed in some detail below are designed with mechanical properties that increase the transfer of vibrational energy from a vibration source to a piezoelectric element. Such meta-substrates may be incorporated in piezoelectric energy harvesters to increase electric power output. The piezoelectric element converts the vibration energy to electric current, which current may be used to provide electric power to a wireless device or charge a battery.

In accordance with the embodiments disclosed herein, the meta-substrate combines two metamaterial-based topologies: kirigami and auxetic. The meta-substrate adds the negative Poisson's ratio capability to the kirigami substrate. FIG. 1 is a diagram showing the concept of combining an auxetic cell 2 and a kirigami cell 4 to construct a meta-substrate cell 10 having a combined kirigami-auxetic topology suitable for enhancing the efficiency of a piezoelectric energy harvester. All of the cells are deformable, but are shown in FIG. 1 in their respective undeformed states.

The auxetic cell 2 in this example includes a deformable hexagonal frame 3 that defines a bowtie-shaped opening 54. More specifically, the shape of opening 54 is a six-sided concave polygon formed by three sets of parallel lines. The deformable hexagonal frame 3 comprises a wall 11, a wall 12, a first flexible structure 14/16 which connects wall 11 to wall 12, and a second flexible structure 18/20 which connects wall 11 to wall 12. More specifically, the first flexible structure includes a first flexural element 14 integrally connected to the wall 11 by a first flexural hinge 1a and a second flexural element 16 integrally connected to the wall 12 by a second flexural hinge 1b, while the second flexible structure includes a third flexural element 18 integrally connected to the wall 11 by a third flexural hinge 1c and a fourth flexural element 20 integrally connected to the wall 12 by a fourth flexural hinge 1d. The first and second flexural elements 14 and 16 are connected to each other by a fifth flexural hinge 1e, while the third and fourth flexural elements 18 and 20 are connected to each other by a sixth flexural hinge 1f. The fifth and sixth flexural hinges 1e and 1f are separated by a gap that is the narrowest point of opening 54. The deformable hexagonal frame 3 is designed such that the size of the gap increases as the walls 11 and 12 move away from each other.

The kirigami cell 4 in this example includes a deformable substrate 5 having first and second cuts 8a and 8b which are uniaxial when the deformable substrate 5 is undeformed as depicted in FIG. 1. The topologies of the auxetic cell 2 and kirigami cell 4 may be combined to form a meta-substrate cell 10 in a manner that adds the cuts 8a and 8b of the kirigami cell 4 to the negative Poisson's ratio capability of the auxetic cell 2.

The meta-substrate cell 10 in this example includes a deformable frame 6 that defines a bowtie-shaped opening 54. The deformable frame 6 comprises a wall 11, a wall 12, a first flexible structure 22/24 which connects wall 11 to wall 12, and a second flexible structure 26/28 which also connects wall 11 to wall 12. More specifically, the first flexible structure includes a first flexural element 22 integrally connected to the wall 11 by a first flexural hinge 1a and a second flexural element 24 integrally connected to the wall 12 by a second flexural hinge 1b, while the second flexible structure includes a third flexural element 26 integrally connected to the wall 11 by a third flexural hinge 1c and a fourth flexural element 28 integrally connected to the wall 12 by a fourth flexural hinge 1d. The first through fourth flexural elements each have a trapezoidal shape.

The first and second flexural elements 22 and 24 form a first cut 8a when the first flexible structure is in an unflexed (undeformed) state and are connected to each other by a fifth flexural hinge 1e that closes a closed end of the first cut 8a. Similarly, the third and fourth flexural elements 26 and 28 form a second cut 8b when the second flexible structure is in an unflexed (undeformed) state and are connected to each other by a sixth flexural hinge 1f that closes a closed end of the second cut 8b. The first and second cuts 8a and 8b are collinear when the first and second flexible structures are in their unflexed (undeformed) states. The fifth and sixth flexural hinges 1e and 1f are separated by a gap that is the narrowest point of opening 54. The deformable frame 6 is designed such that the size of the gap increases as the walls 11 and 12 move away from each other, as will be shown later with reference to FIGS. 6A and 6B.

The meta-substrate cell 10 seen in FIG. 1 may be incorporated as a central portion in a larger meta-substrate that is coupled (e.g., glued) to a host structure that has vibrational modes. Piezoelectric energy harvesters comprising such meta-substrates will be described in more detail below with reference to FIGS. 7-11. In those cases, the meta-substrate cell 10 may be coupled (e.g., glued) to one or two piezoelectric elements which convert the vibrations into electric power. For example, the walls 11 and 12 may be integrally formed with or attached to respective plates made of the same metamaterial used to fabricate the auxetic frame 6. Suitable materials include aluminum, steel, stainless steel, polymer, and fiber-reinforced plastic composites. As the plates move alternatingly toward and away from each along a longitudinal axis under the effect of vibration, the flexible structures that connect walls 11 and 12 expand and retract alternatingly in a transverse direction, which transverse motion is imparted to the one or two piezoelectric elements.

In alternative embodiments, multiple meta-substrate cells 10 may be arranged in series to form a cantilever beam having one end affixed to a host structure that has vibrational modes. Such host structures will be described in more detail below with reference to FIG. 12. In this case, each meta-substrate cell 10 in the row of cells is coupled to a respective piezoelectric element or sandwiched between a respective pair of piezoelectric element which convert the vibrations into electric power. For example, the wall 12 of one meta-substrate cell may be integrally formed with or attached to the wall 11 of an adjacent cell.

The meta-substrate cell 10 may be fabricated using laser cutting (a.k.a. laser beam machining) or a 3-D or 4-D printing technique (also known as additive manufacturing) or both techniques depending on the application of the meta-substrate. To clarify, for example, if the meta-substrate is intended to be used as an embedded device, the best way to manufacture the whole structure (meta-substrate+host structure) is by using a 3-D or 4-D printing process. According to the usage, the material of the meta-substrate might be changed from flexible (polymer) to hard (steel), in which case the use of a laser cutter would be preferred as a faster/cheaper alternative. Even the size of the meta-substrate may be an important factor in deciding to use additive manufacturing for making the meta-substrate. For smaller applications, the 3-D or 4-D printing could be a more precise method.

As used herein, the terms "3-D printing" and "additive manufacturing" are used synonymously to refer to processes in which material is joined or solidified under computer control to create a three-dimensional object, with material being added together. One advantage of the 3-D printing methodology is that continuous fiber rovings (e.g., carbon fibers) impregnated with a liquid epoxy-hardener mixture can be printed without human manipulation in an autonomous manner.

Figure 2:
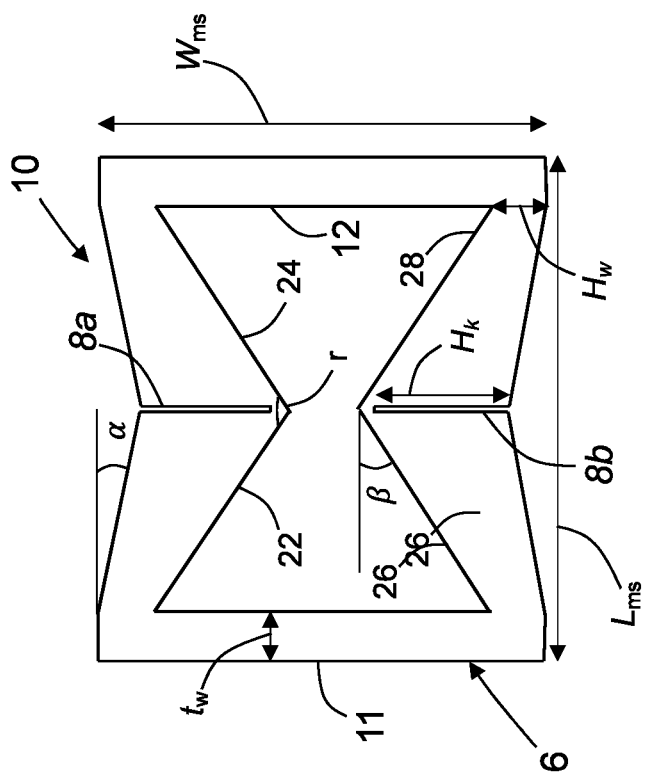
FIG. 2 is a diagram and a table respectively showing and listing various dimensions of a meta-substrate cell comprising an auxetic frame (negative Poisson's ratio) having first and second kirigami cuts in accordance with one design.

FIG. 2 is a diagram and a table respectively showing and listing various dimensions of a meta-substrate cell 10 comprising an auxetic frame 6 (negative Poisson's ratio) having first and second kirigami cuts 8a and 8b in accordance with one design. The meta-substrate applies some kirigami cuts to an auxetic framework to increase multi-directional expansion by enabling an adequate amount of deformation. The meta-substrate unit cell configuration with details is shown in FIG. 2, while various dimensional parameters are defined in the table. This design is based on a network of connected four trapezoids (first through fourth flexural elements 22, 24, 26, 28) with two opposing kirigami cuts 8a and 8b. FIG. 2 shows the meta-substrate cell 10 in an undeformed state. When this structure is placed under tension, the kirigami cuts open up and the trapezoids swing outward, causing the meta-substrate cell 10 to expand in both the longitudinal and transverse directions. In the undeformed state, the internal cell angle β may be equal to or greater than the external cell angle α. In the deformed state, the external cell angle α may optionally be approximately equal to 0 degrees (as seen in FIG. 6B).

Figure 3:
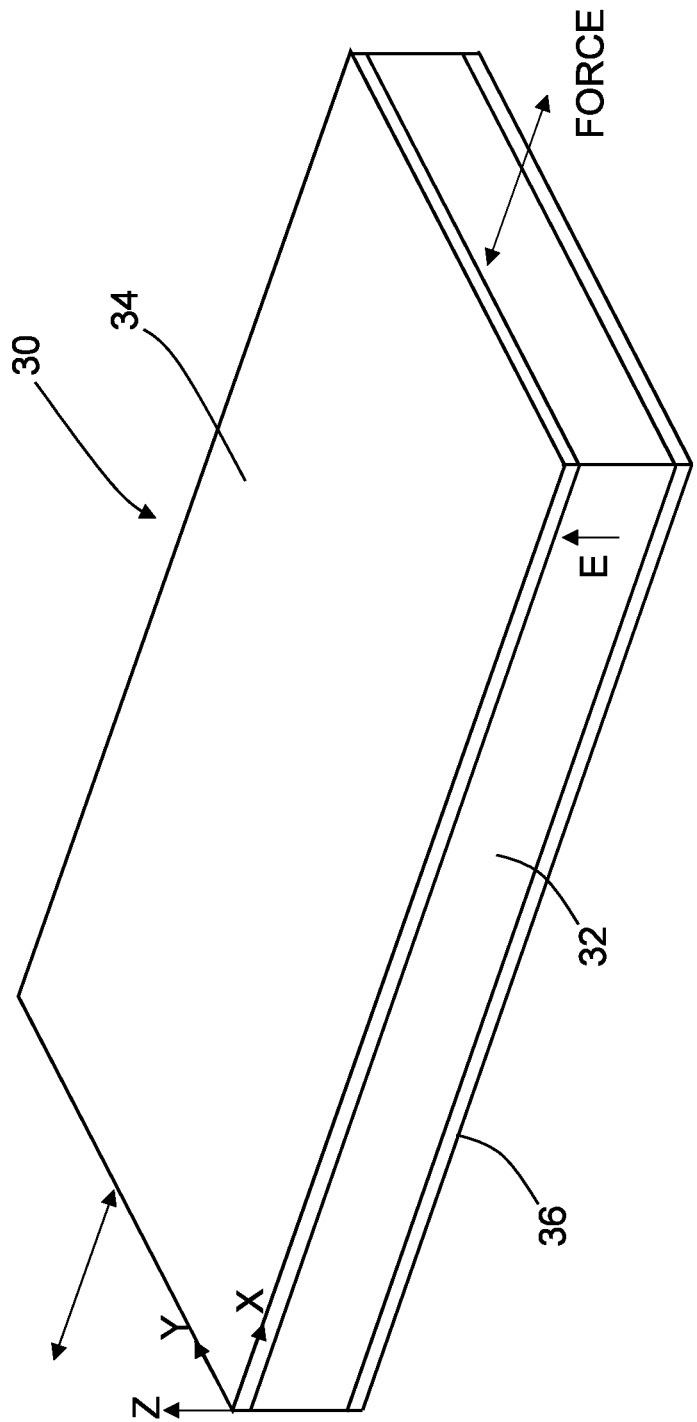
FIG. 3 is a diagram representing a three-dimensional (3-D) view of a piezoelectric element. The double-headed arrows indicate a tension or compression force being applied to opposing ends of the piezoelectric element in a direction parallel to the X axis.

A meta-substrate piezoelectric energy harvester (MPEH) may be constructed by gluing a piezoelectric element to the meta-substrate cell 10 depicted in FIGS. 1 and 2. FIG. 3 is a diagram representing a 3-D view of a piezoelectric element 30. The piezoelectric element 30 includes a piezoelectric substrate 32 sandwiched between a pair of electrodes 34 and 36. The piezoelectric substrate 32 is made of a piezoelectric material; the electrodes 34 and 36 are made of electrically conductive material. The double-headed arrows in FIG. 3 indicate a tension or compression force being applied to opposing ends of the piezoelectric element 30 in a direction parallel to the X axis.

One suitable piezoelectric material is lead zirconium titanate (piezoelectric transducer). piezoelectric transducer comprises a network of asymmetric dipole crystals which can be organized when any mechanical stresses are applied to the structure, which property enables piezoelectric transducer to generate electrical potentials in direct proportion to the applied forces. The constitutive equation for the electromechanical characteristic of a linear piezoelectric sensor is defined as:

$$\begin{Bmatrix} D \\ \sigma \end{Bmatrix} = \begin{bmatrix} \varepsilon^s & d \\ -d^T & k^E \end{bmatrix} \begin{Bmatrix} E \\ S \end{Bmatrix} \quad (1)$$

where D, σ, $k^E$, and $\varepsilon^s$ denote, respectively, the dielectric displacement vector (the electrical charge density), applied stress vector, stiffness matrix, and permittivity matrix; and S, $d^T$, and E represent the strain, piezoelectric constant matrix, and electric field, respectively. The following discussion assumes that the piezoelectric transducer is polarized along the thickness (Z) direction (see FIG. 3).

Accordingly, the piezoelectric constitutive equations will be expressed as:

$$\begin{Bmatrix} D_3 \\ \sigma_1 \end{Bmatrix} = \begin{bmatrix} \varepsilon^s_{33} & d_{31} \\ -d_{31} & k^E_{11} \end{bmatrix} \begin{Bmatrix} E_3 \\ S_1 \end{Bmatrix} \quad (2)$$

Figure 4:
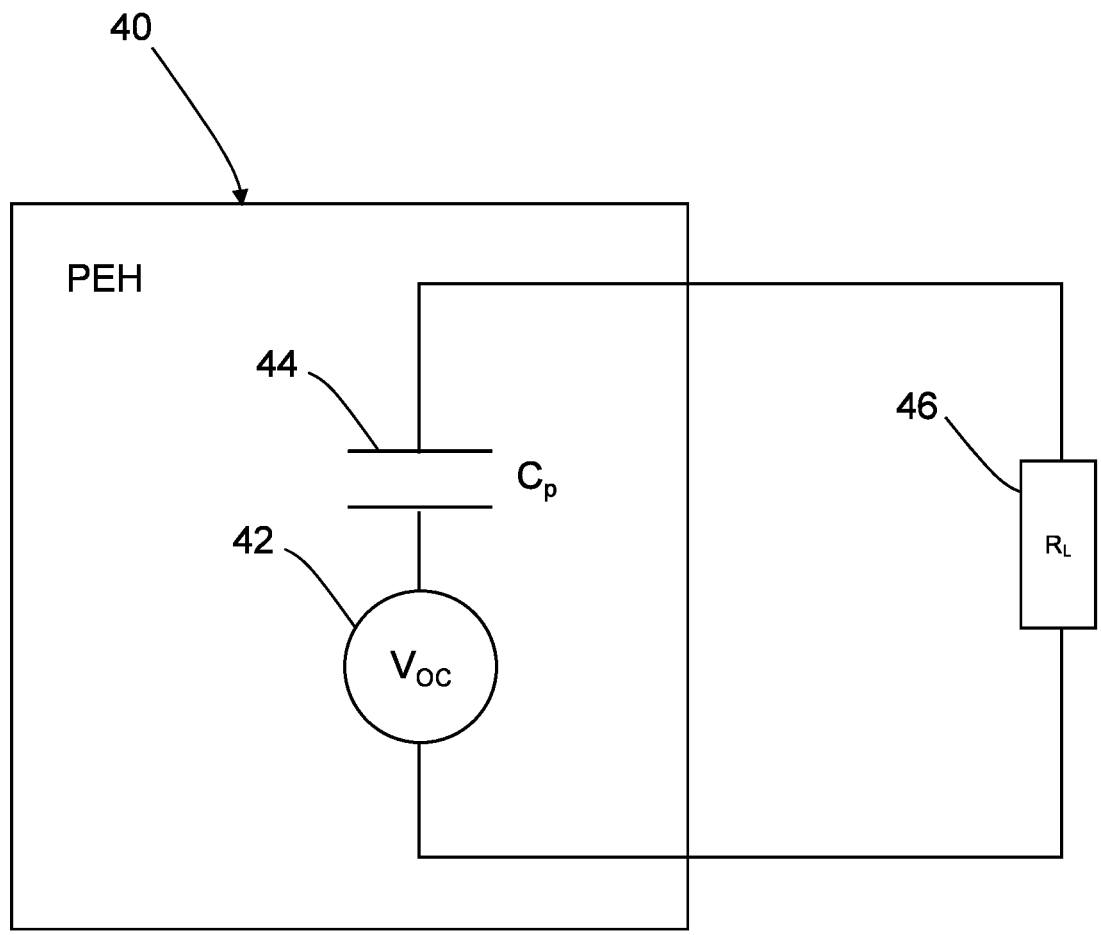
FIG. 4 is a diagram representing an equivalent circuit model of a piezoelectric energy harvester connected to a load resistor.

Assuming an isotropic behavior for the piezoelectric transducer and a plain stress condition ($\sigma_{33}=0$), the electric displacement along the Z axis may be defined as:

$$D_3 = d_{31}(\sigma_{11} + \sigma_{22}) \quad (3)$$

where the piezoelectric constant $d_{31}$ denotes the charge per electrode area per unit stress applied along the X axis. According to the conditions satisfying this equal-power requirement for a conventional piezoelectric energy harvester, a circuit model representing a strain energy harvester 40 connected to a load resistor 46 is depicted in FIG. 4. The strain energy harvester 40 is modeled as an open-circuit voltage generator 42 connected in series with a capacitor 44.

Due to the fact that the piezoelectric transducer ceramic is a bulk structure ($d_{31}=d_{32}$), when a uniaxial stretching load is applied to the strain energy harvester 40, the root mean square of the voltage for the open circuit of the piezoelectric transducer is calculated by Eqs. (4) and (5):

$$V_{OC} = \frac{t_p D_3}{\varepsilon_0 \varepsilon_{33} \sqrt{\pi}} = \frac{t_p d_{31}}{\varepsilon_0 \varepsilon_{33} \sqrt{\pi}} (\sigma_{11} + \sigma_{22}) \quad (4)$$

$$V_{RMS} = \frac{V_{OC}}{\sqrt{2}} \quad (5)$$

The maximum power output (see Eq. (7)) of the piezoelectric energy harvester is at the optimal load resistance (see Eq. (6)) which matches the internal impedance of the strain energy harvester:

$$R_L = \frac{1}{2\pi f C_p} = \frac{t_p}{2\pi f \varepsilon_0 \varepsilon_{33} A_p} \quad (6)$$

$$P_{opt} = \frac{V_{RMS}^2}{R_L} = \frac{f A_p t_p d_{31}^2}{\varepsilon_0 \varepsilon_{33}} (\overline{\sigma_{11}} + \overline{\sigma_{22}})^2 \quad (7)$$

where $t_p$ is the layer thickness of the piezoelectric transducer; f is the excitation frequency; $C_p$ is the capacitance between the electrodes of two sides of the piezoelectric transducer; $A_p$ is the electrode area of the piezoelectric transducer; $R_L$ is the load resistance; $\varepsilon_{33}$ is the relative permittivity of the piezoelectric transducer; and $\varepsilon_0$ is the permittivity of free space ($\varepsilon_0 = 8.85 \times 10^{-12}$ c$^2$/N-m$^2$).

As expressed by Eq. (7), one may conclude that the electrical charge density of any piezoelectric energy harvester is proportionally related to the average lateral $\overline{\sigma_{22}}$ stress as well as axial $\overline{\sigma_{11}}$ stress. Hence, if one utilizes a piezoelectric energy harvester that includes a meta-substrate, one may expect to improve the power output of the piezoelectric energy harvester significantly because the meta-substrate stretches the piezoelectric transducer in two directions at once due to its negative Poisson's ratio. Furthermore, the meta-substrate behaves more stretchably with enhanced strain capacity owing to its kirigami cut, which can boost the stress concentrations into the piezoelectric element.

Figure 5A:
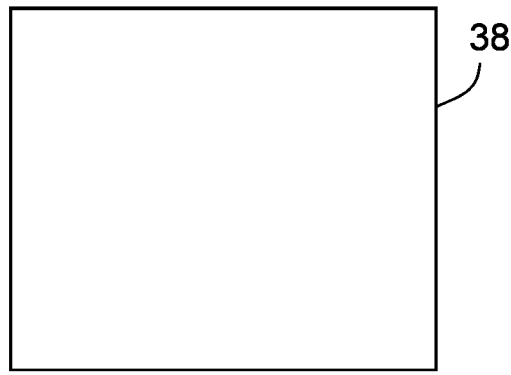
FIGS. 5A and 5B are diagrams representing top views of a plain substrate in an undeformed state (FIG. 5A) and in a deformed state (FIG. 5B). The arrows in FIG. 5B indicate the movements of various portions of the plain substrate when tensile forces are applied to opposite ends of the plain substrate.
Figure 5B:
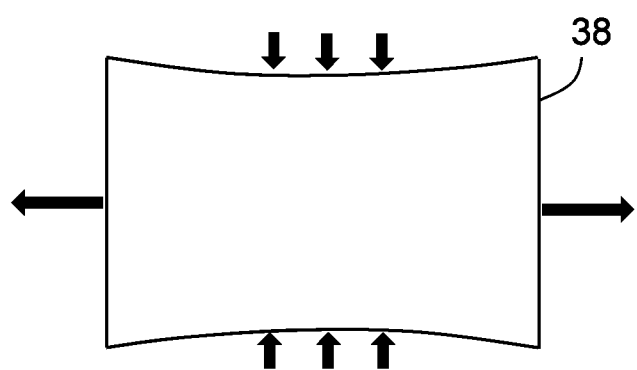

FIG. 5A is a diagram representing a top view of a plain substrate 38 in an undeformed state. As used herein, the term "plain substrate" means a substrate made of a material having a positive Poisson's ratio. FIG. 5B is a diagram representing a top view of a plain substrate 38 in a deformed (tensioned) state. The arrows in FIG. 5B indicate the movements of various portions of the plain substrate 38 when a tensile force is applied to opposite uncut ends of the plain substrate 38.

Figure 6A:
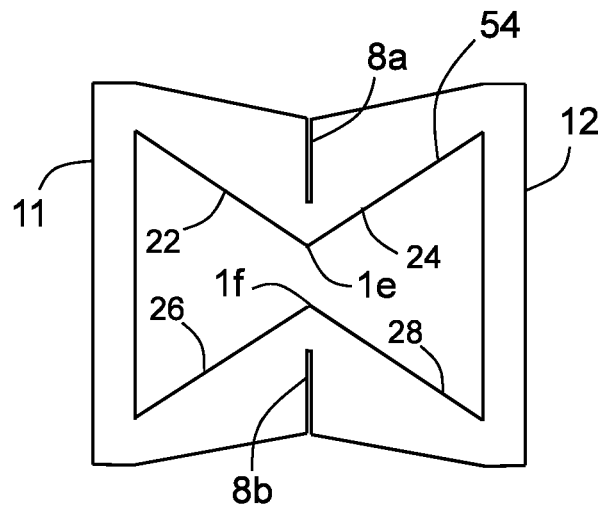
FIGS. 6A and 6B are diagrams representing top views of the meta-substrate cell depicted in FIG. 2 in an undeformed state (FIG. 6A) and in a deformed state (FIG. 6B). The arrows in FIG. 6B indicate the movements of various portions of the meta-substrate cell when tensile forces are applied to opposite ends of the cell.
Figure 6B:
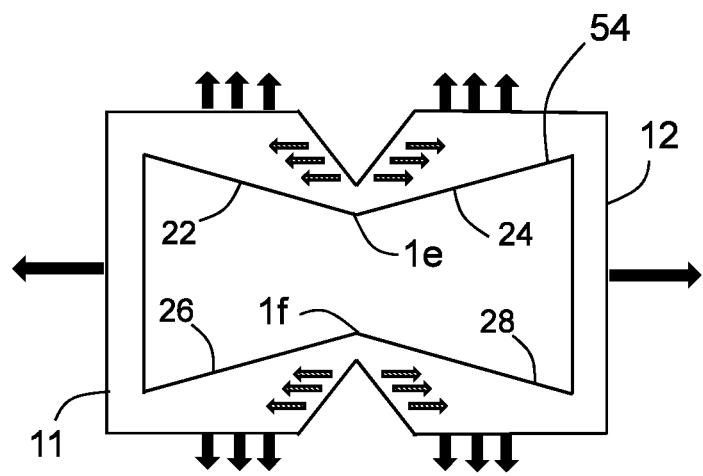

In contrast, FIG. 6A is a diagram representing a top view of the meta-substrate cell 10 depicted in FIGS. 1 and 2 in an undeformed state. FIG. 6B shows the same meta-substrate cell 10 in a deformed state. The arrows in FIG. 6B indicate the movements of the first through fourth flexural elements 22, 24, 26, 28 of the meta-substrate cell 10 when a tensile force is applied to walls 11 and 12 at opposite uncut ends of the meta-substrate cell 10. When this structure is placed under tension along the X axis, the cuts 8a and 8b open while the gap between the fifth and sixth flexural hinges 1e and 1f increases in size. More specifically, the bowtie shape of opening 54 tends toward rectangular as the first through fourth flexural elements 22, 24, 26, 28 flex outward in opposite transverse directions.

Figure 7:
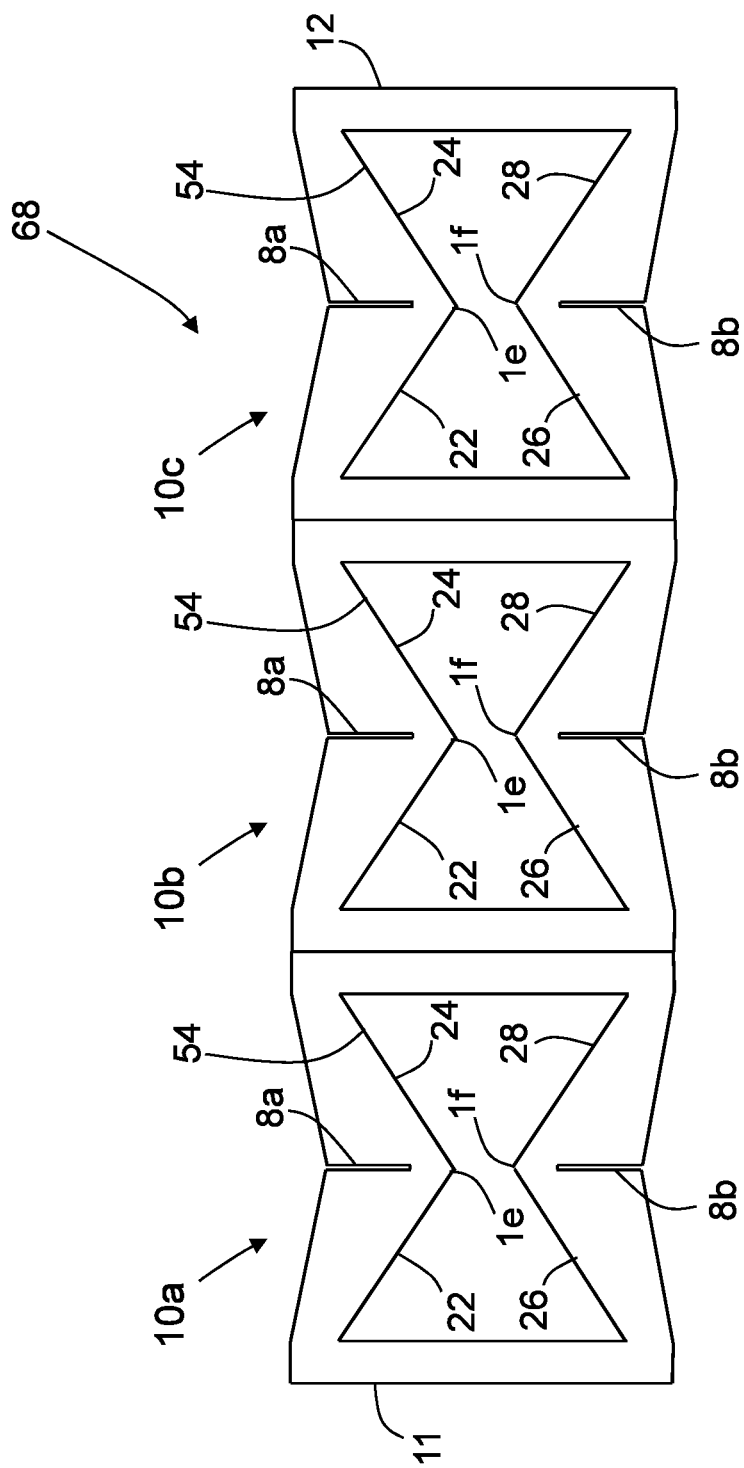
FIG. 7 is a diagram showing three meta-substrate cells connected in series to form a linear meta-substrate cell array without piezoelectric elements.

FIG. 7 is a diagram showing three meta-substrate cells 10a-10c connected in series to form a linear meta-substrate cell array 68 without piezoelectric elements. A strip-shaped MPEH may be formed by gluing respective piezoelectric elements. Such a linear meta-substrate cell array provides a preferred rectangular shape, but also accelerates the meta-substrate mechanism because each of the meta-substrate cells 10a-10c may axially push the next cell to produce synergistic vibrations.

Figure 8:
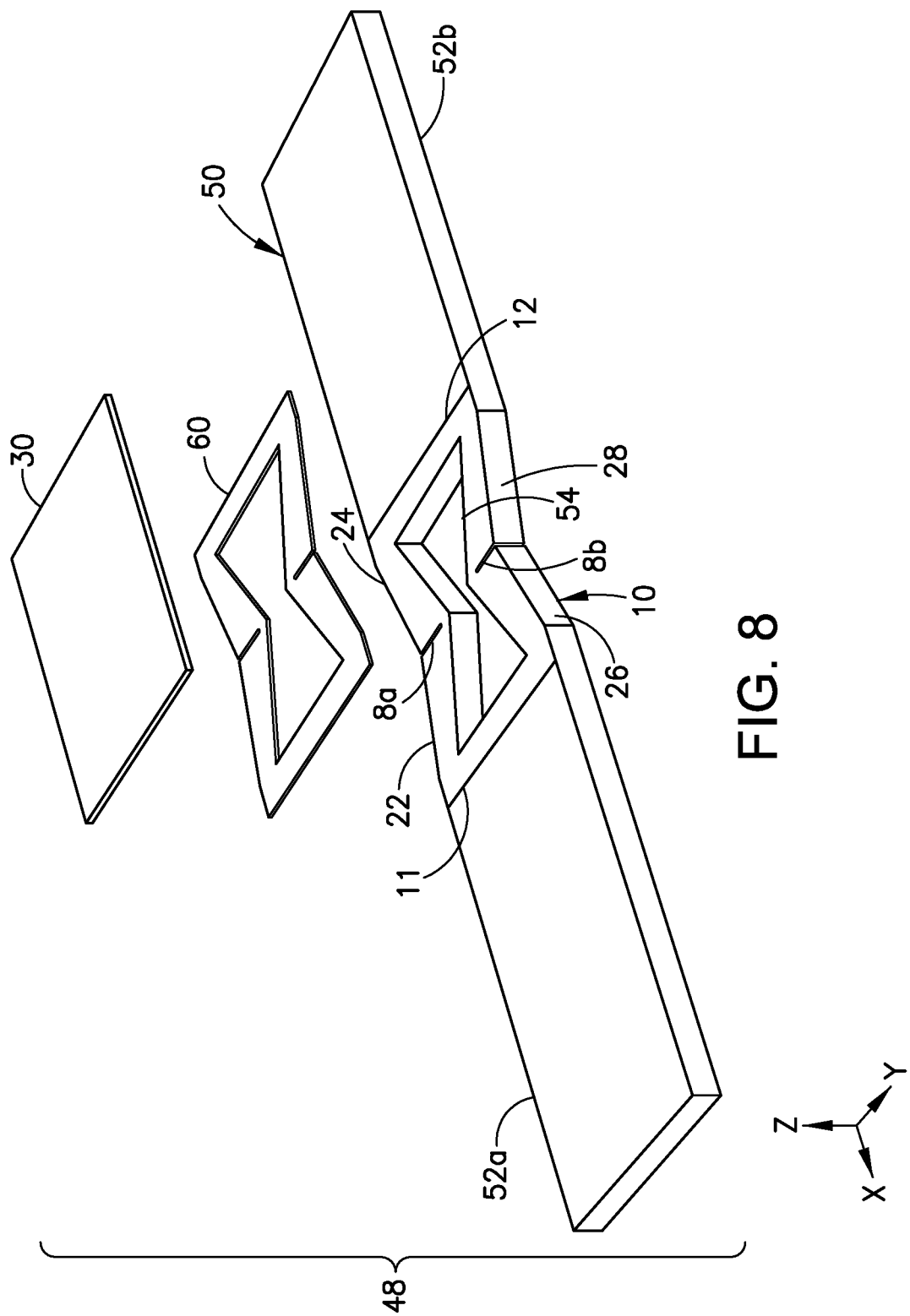
FIG. 8 is a diagram representing an exploded 3-D view of components of a meta-substrate piezoelectric energy harvester in accordance with another embodiment.
Figure 10:
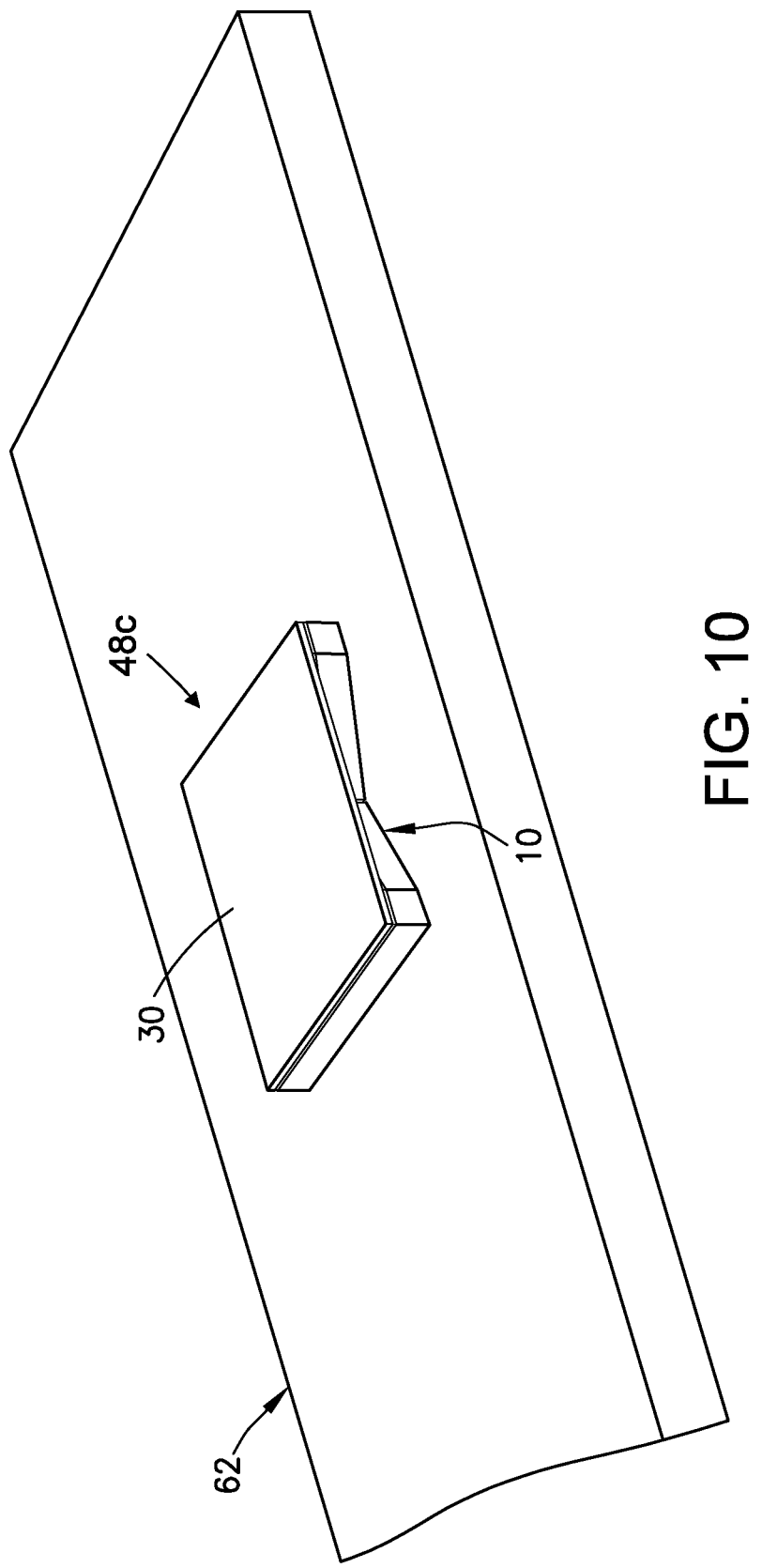
FIG. 10 is a diagram representing a 3-D view of a strain-type meta-substrate piezoelectric energy harvester in which a piezoelectric element is attached to a meta-substrate booster that is integrally formed with a host structure by the same manufacturing process, such as 3-D or 4-D printing.

FIG. 8 is a diagram representing an exploded 3-D view of components of a meta-substrate piezoelectric energy harvester 48 (hereinafter "MPEH 48") comprising a piezoelectric element 30 bonded to a meta-substrate cell 10 incorporated as a central portion in a larger meta-substrate 50. The meta-substrate 50 is coupled to a host structure that has vibrational modes. The piezoelectric element 30 is bonded to the meta-substrate cell 10 by a thin layer of elastic glue 60 (e.g., silicone or epoxy), which is applied on the upper surface of the meta-substrate cell 10. The meta-substrate cell 10 and plate-shaped bodies 52a and 52b are made of the same metamaterial. The walls 11 and 12 may be either integrally formed with or attached to the plate-shaped bodies 52a and 52b respectively of the meta-substrate 50. It should be appreciated that the lines in FIG. 10 indicating the boundaries of walls 11 and 12 are inapplicable in the case where the walls 11 and 12 are integrally formed with the plate-shaped bodies 52a and 52b respectively. The MPEH components depicted in FIG. 10 are assembled by gluing piezoelectric element 30 to meta-substrate cell 10, thereby coupling the two components together. The piezoelectric element 30 vibrates when the meta-substrate cell 10 vibrates. When the MPEH is in turn mounted to a component or part of a vehicle, the magnitude of vibrations induced in the piezoelectric element 30 by the vibrating component or part will be magnified by the meta-substrate cell 10, thereby increasing the power efficiency of the MPEH.

Figure 9:
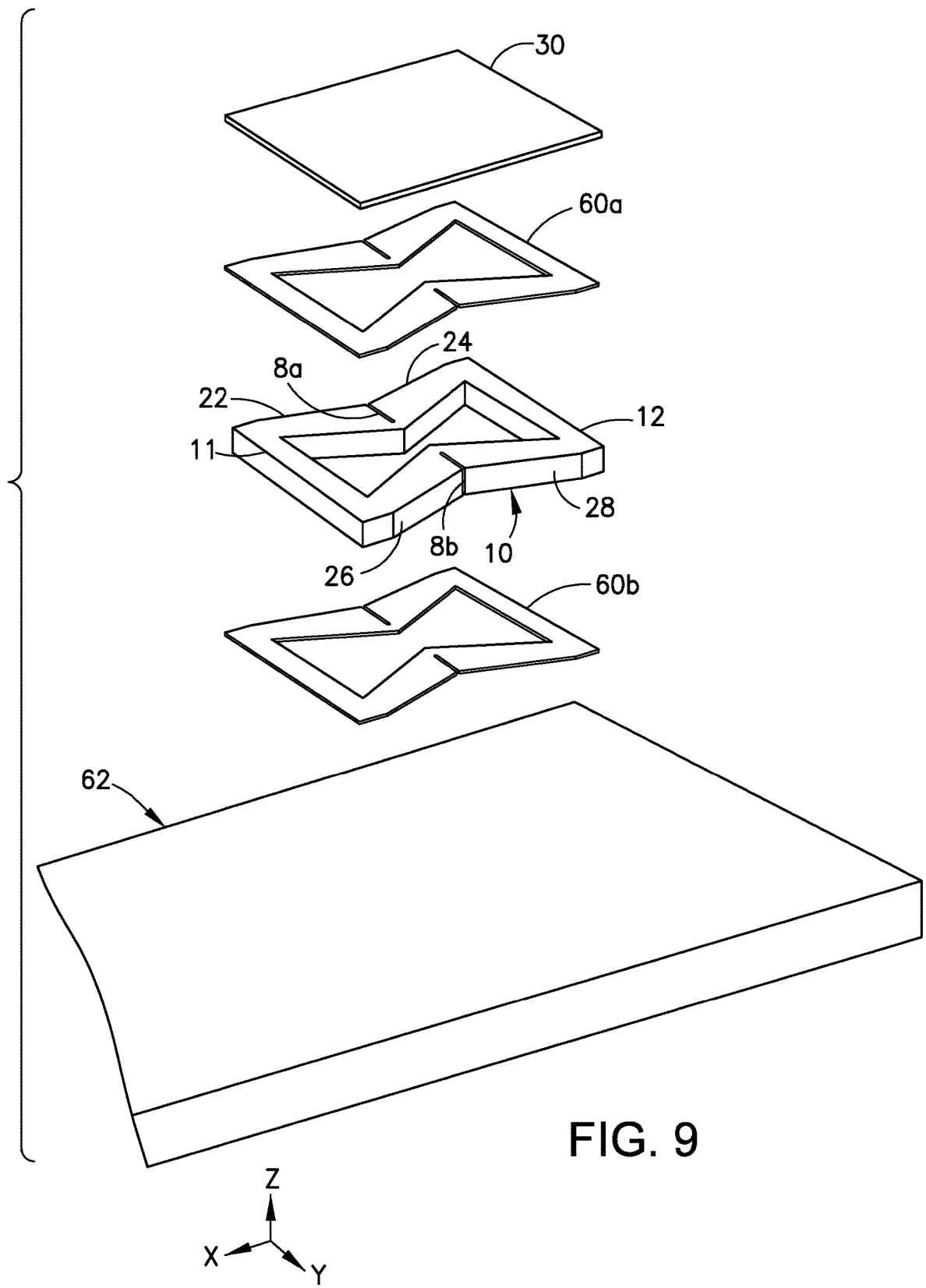
FIG. 9 is a diagram representing an exploded 3-D view of components of a strain-type piezoelectric energy harvester having a meta-substrate booster for general application to a host structure that has vibrational modes.

FIG. 9 is a diagram representing an exploded 3-D view of components of a strain-type piezoelectric energy harvester having a meta-substrate booster for general application to a host structure 62 that has vibrational modes. For example, the host structure 62 may be a shell plate. The harvester components include a piezoelectric element 30 and a meta-substrate cell 10. The meta-substrate cell 10 is configured to act as a booster that amplifies the strain waves produced by the host structure 62, thereby increasing the energy efficiency of the piezoelectric element 30. The piezoelectric element 30 will be bonded to the meta-substrate cell 10 by a first thin layer of elastic glue 60a (e.g., epoxy). The meta-substrate cell 10 in turn will be bonded to host structure 62 by a second thin layer of elastic glue 60b.

FIG. 10 is a diagram representing a 3-D view of a strain-type meta-MPEH 48c in which a piezoelectric element 30 is attached to a meta-substrate booster that has been integrally formed with a host structure 62 by the same manufacturing process, such as 3-D or 4-D printing. In this example, the meta-substrate booster is a meta-substrate cell 10 of the type depicted in FIGS. 6A and 6B. As the host structure 62 vibrates, the resulting strain waves are amplified by the meta-substrate cell 10, thereby enabling the piezoelectric element 30 to generate increased electrical power than would otherwise be the case were the piezoelectric element 30 simply glued directly to the host structure 62. The MPEH 48c may be constructed on the host structure 62 at any place where vibrational energy is available for harvesting.

Figure 11:
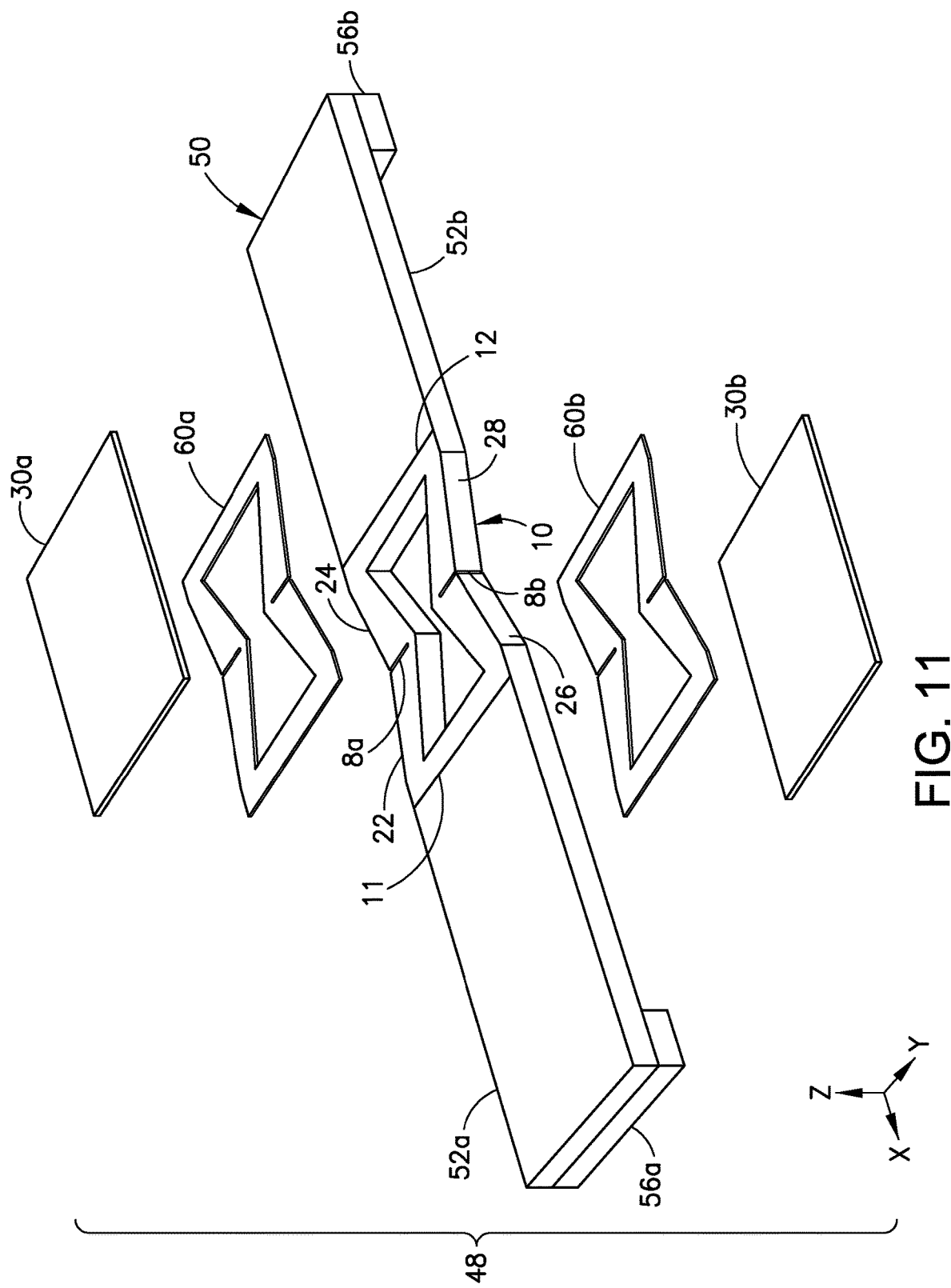
FIG. 11 is a diagram representing an exploded 3-D view of components of a meta-substrate piezoelectric energy harvester comprising a meta-substrate sandwiched between two piezoelectric elements in accordance with a further embodiment.

FIG. 11 is a diagram representing an exploded 3-D view of components of a MPEH 48 comprising a meta-substrate 50 sandwiched between two piezoelectric elements 30a and 30b in accordance with another embodiment. The first piezoelectric element 30a will be bonded to the meta-substrate cell 10 by a first thin layer of elastic glue 60a, which is applied on the upper surface of the meta-substrate cell 10. The second piezoelectric element 30b will be bonded to the meta-substrate cell 10 by a second thin layer of elastic glue 60b, which is applied on the lower surface of the meta-substrate cell 10. The MPEH components depicted in FIG. 11 are assembled by gluing piezoelectric elements 30a and 30b to meta-substrate cell 10, thereby coupling both piezoelectric elements to the meta-substrate cell. Thus, both piezoelectric elements 30a and 30b vibrate when the meta-substrate cell 10 vibrates.

Figure 12:
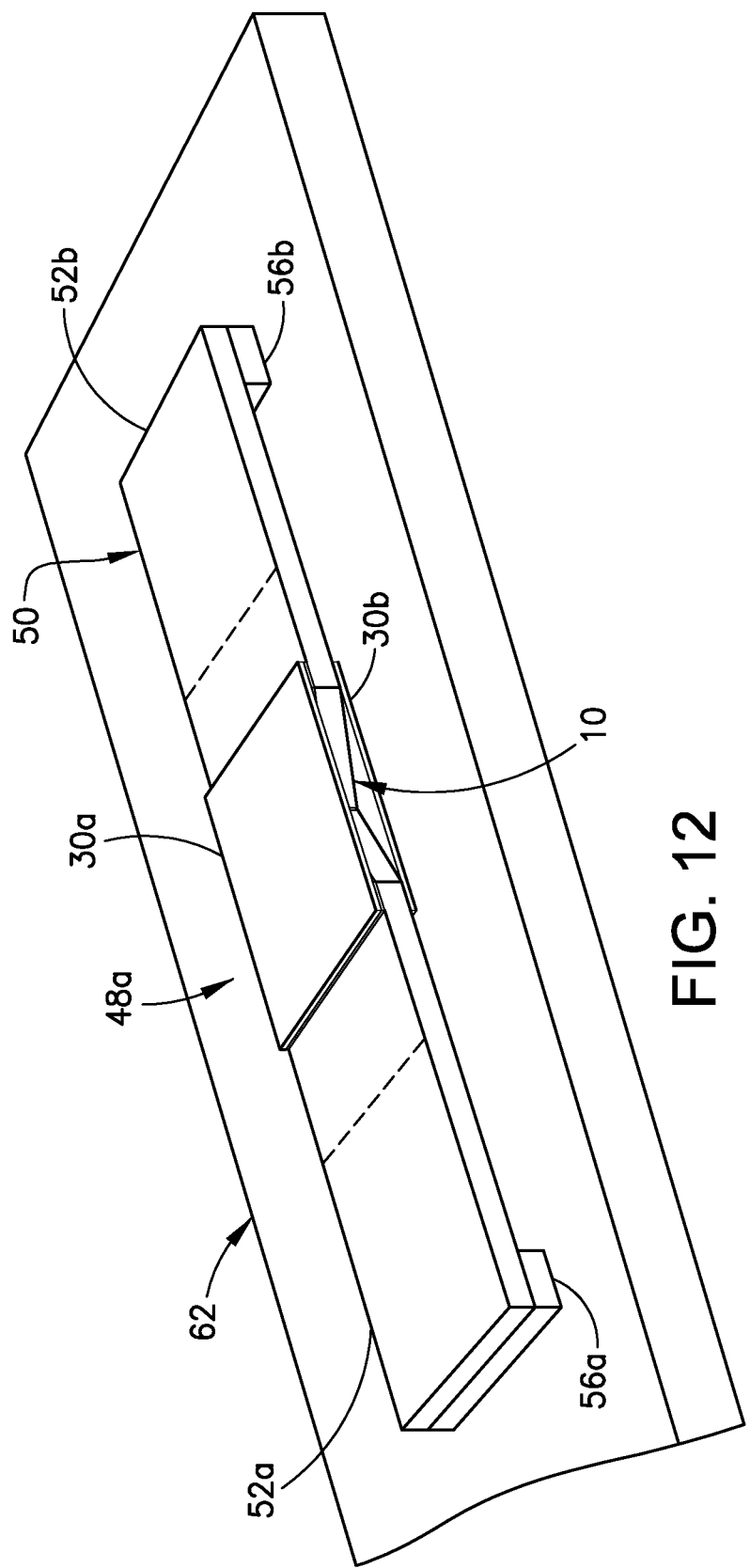
FIG. 12 is a diagram representing a 3-D view of the components depicted in FIG. 11 assembled on a host structure that has vibrational modes.

FIG. 12 is a diagram representing a 3-D view of the components depicted in FIG. 11 now assembled to form a strain type of MPEH 48a that bridges a pair of pedestals 56a and 56b (hereinafter "bridging MPEH 48a"). The bridging MPEH 48a is shown mounted to a host structure 62 that has vibrational modes. For example, the host structure 62 may be a vehicle component or part that is subject to vibration during vehicle movement. In the embodiment depicted in FIG. 12, the pedestals 56a and 56b are attached to the lower surface of meta-substrate 50 at opposite ends thereof. Those pedestals 56a and 56b in turn may be attached to the host structure 62. For example, in a case where the lower surface of meta-substrate 50 and the confronting surface of the host structure 62 are planar, the pedestals 56a and 56b are designed to ensure that the lower surface of meta-substrate 50 and the confronting surface of host structure 62 are parallel and separated by a gap having a height greater than the thickness of the piezoelectric element 30b. In this case, vibrations in the underlying host structure 62 cause the pedestals 56a and 56b to vibrate, which in turn causes the bridging MPEH 48a to amplify the vibration. The bridging MPEH 48a may, in the alternative, have one piezoelectric element 30 as depicted in FIG. 10 instead of two piezoelectric elements 30a and 30b as depicted in FIG. 12.

The MPEHs depicted in FIGS. 7-12 may be designed to vibrate at both high and low frequencies. At a low frequency, conventional piezoelectric energy harvesters are unable to generate any usable power. In contrast, a MPEH configured with cells having auxetic frames with two kirigami cuts makes it possible to generate usable power at low frequency. At low excitation, a small-sized (e.g., 20 mm) MPEH of the type proposed herein generates up to 3000 μW of power, which easily satisfies the minimum electric power required by a sensor node in a wireless sensor network. This generated power was for a unimorph MPEH (having one piezoelectric element) of the type depicted in FIG. 10 and will be almost doubled for a bimorph MPEH (having two piezoelectric elements) of the type depicted in FIG. 12. In addition, the power output will increase with increasing size. In addition, simulations demonstrated that a MPEH comprising an auxetic frame with two kirigami cuts: (a) generates 19.3 times more power than an equivalent conventional PEH at low frequencies (1-4 Hz) and sinusoidal strain amplitudes (50 to 550με); and (b) generates 18.1 times more power than an equivalent conventional PEH at high frequencies (100-1500 Hz). The power gain factor remained constant when the excitation was increased, which means the magnification factor is a function of the meta-substrate geometry and is not dependent on the excitation conditions.

Figure 13:
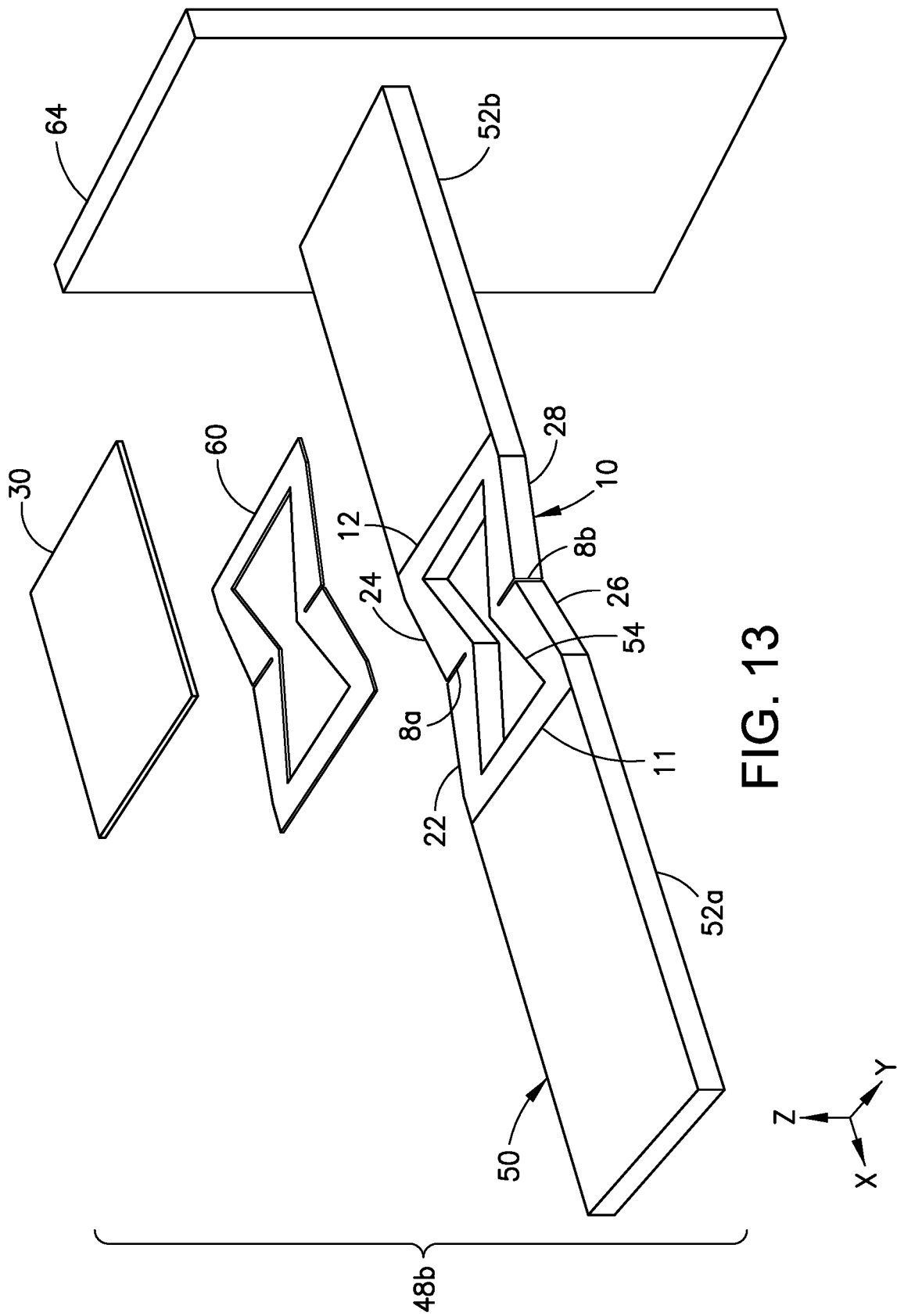
FIG. 13 is a diagram representing an exploded 3-D view of the components depicted in FIG. 10 now attached in cantilever beam fashion to a host structure that has vibrational modes.
Figure 14:
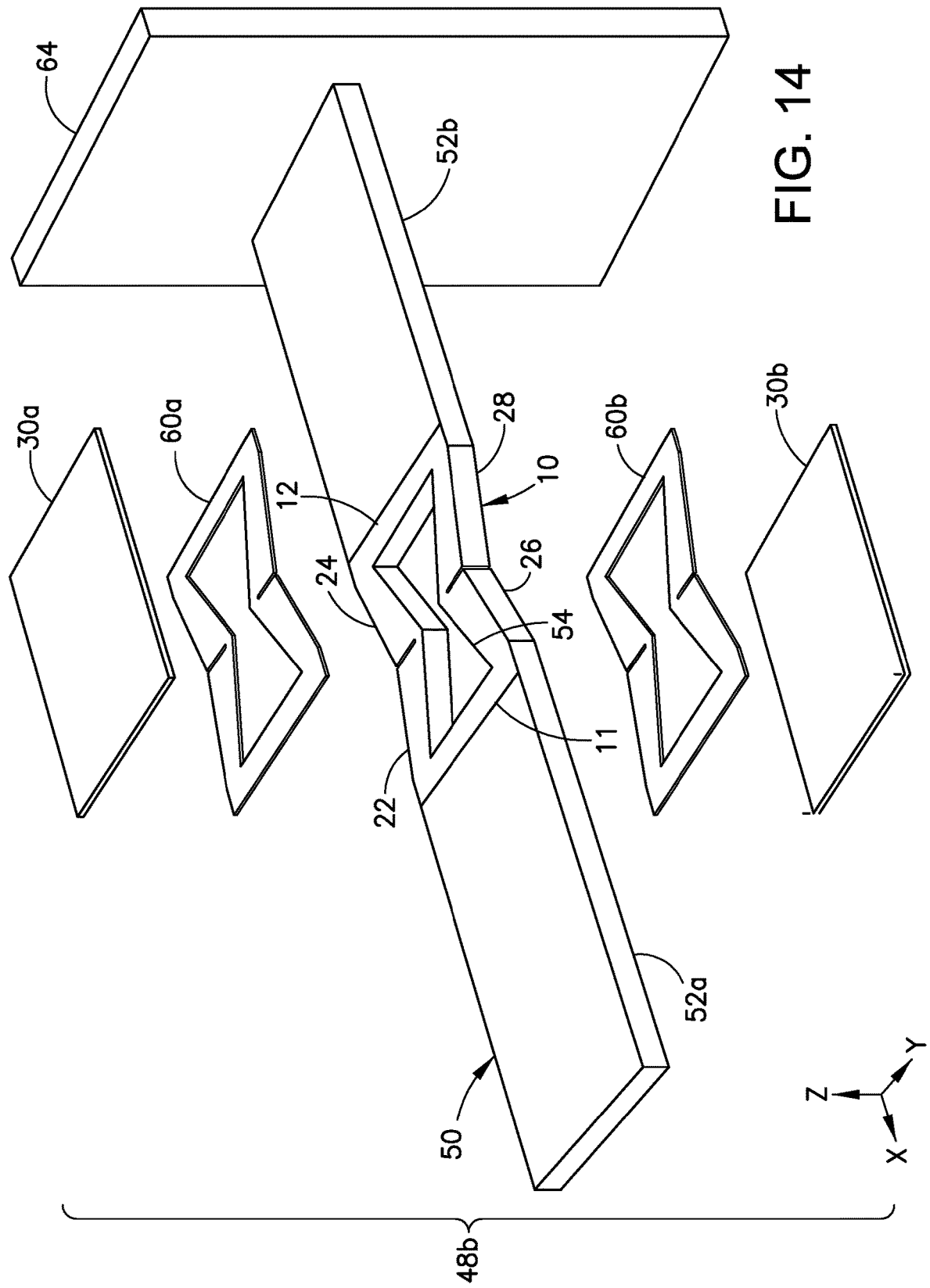
FIG. 14 is a diagram representing an exploded 3-D view of the components of an MPEH attached in cantilever beam fashion to a host structure that has vibrational modes.

In accordance with alternative embodiments, the meta-substrate 50 may be configured as a cantilever beam having one end attached to a host structure while the other end is unconstrained. FIG. 13 is a diagram representing an exploded 3-D view of a cantilevered MPEH 48b including the same components depicted in FIG. 10, with the difference that one end of the meta-substrate 50 is attached in cantilever beam fashion to a host structure 64 that is subject to vibration. Similarly, FIG. 14 is a diagram representing an exploded 3-D view of a cantilevered MPEH 48b including the same components depicted in FIG. 11, with the difference that one end of the meta-substrate 50 is attached in cantilever beam fashion to the host structure 64. At both high and low frequencies, the cantilevered MPEH generates a better power output (up to 10 times) compared to an equivalent conventional cantilevered PEH. This generated power was for a unimorph cantilevered MPEH (having one piezoelectric element 30) of the type depicted in FIG. 13 and will be almost doubled for a bimorph cantilevered MPEH (having two piezoelectric elements 30a and 30b) of the type depicted in FIG. 14.

In accordance with further embodiments, multiple MPEHs may be constructed using a meta-substrate honeycomb structure in strip or shell shapes to create cantilever beams of different lengths designed to harvest energy in respective different ranges of excitation frequency. These multiple different cantilevered MPEHs, operating in unison, form a multi-frequency cantilevered MPEH array that generates power in a broadband frequency range.

Figure 15:
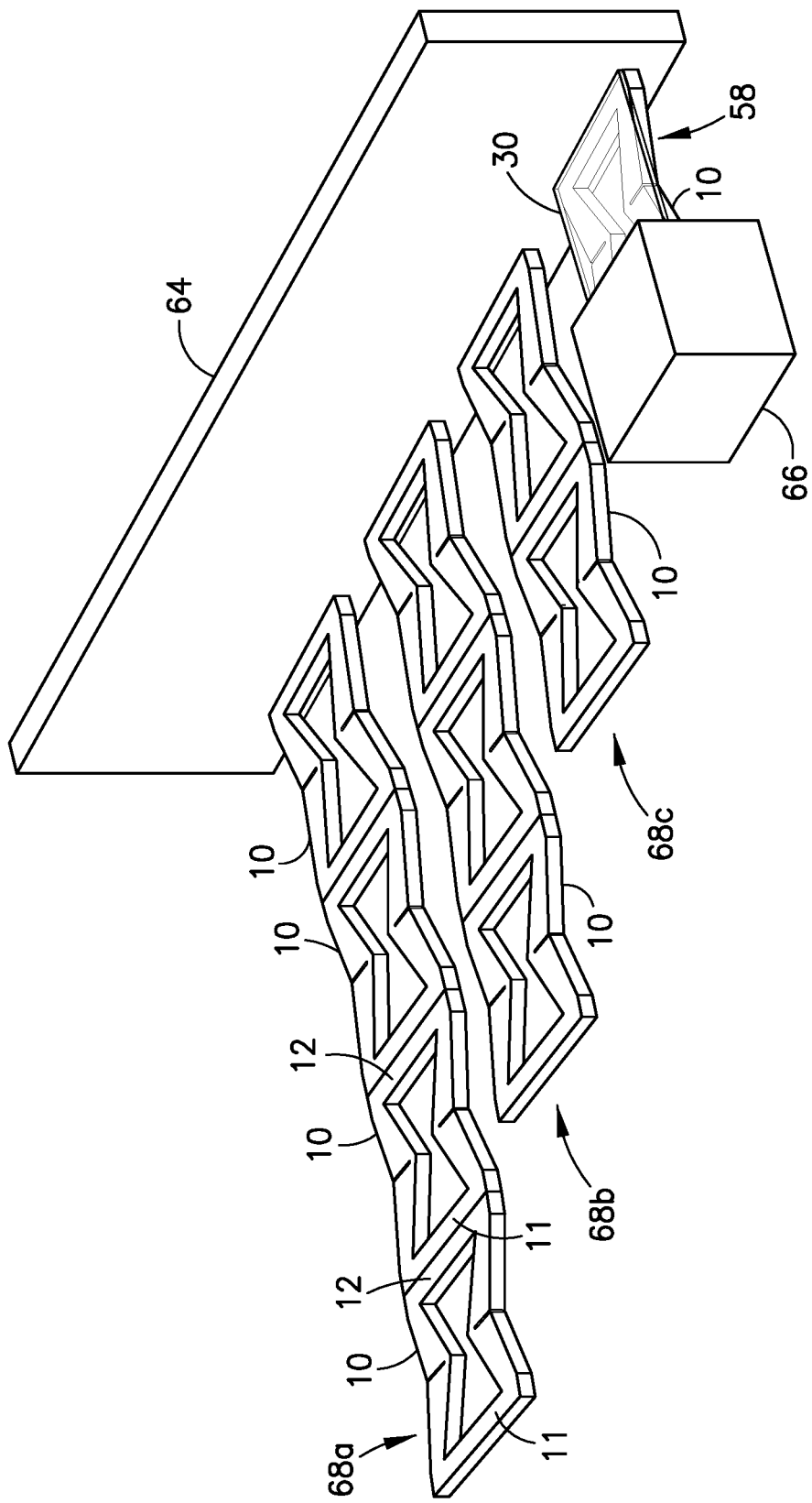
FIG. 15 is a diagram representing 3-D views of four configurations of meta-substrate cell arrays to make a multi-frequency harvesting set-up attached in cantilever beam fashion to a host structure that has vibrational modes.

FIG. 15 is a diagram representing 3-D views of four configurations of meta-substrate cells 10 attached in cantilever beam fashion (in some cases, in series) to a host structure 64 that is subject to vibration when in service. The cantilevered linear meta-substrate cell array 68a includes four meta-substrate cells 10 connected in series (wall to wall) and affixed to host structure 64. The cantilevered linear cell array 68b includes three meta-substrate cells 10 connected in series and affixed to host structure 64. The cantilevered linear meta-substrate cell array 68c includes two meta-substrate cells 10 connected wall to wall and affixed to host structure 64. A respective piezoelectric element (not shown in FIG. 15) may be attached to each meta-substrate cell 10 to form cantilevered MPEHs respectively having different modes of vibration. FIG. 15 further depicts a mass 66 attached to one end of a cantilevered MPEH 58 that has the other end affixed to the host structure 64. The cantilevered MPEH 58 includes a single piezoelectric element glued to a single meta-substrate cell 10. Optionally, to tune the resonance frequency of the cantilevered MPEH 58, a mass 66 may be attached to the distal end of any one of the cantilevered linear meta-substrate cell arrays 68a-68c depicted in FIG. 15. The mass may be selected in dependence on the desired vibrational mode.

As the resonance frequency of any cantilever beam depends on certain design parameters (mass, modulus of elasticity, and thickness of the piezoelectric element as well as the meta-substrate), one can design beams with different sizes using meta-substrate honeycomb structures (strip and shell shapes) that are respectively configured to have bending modes responsive to different excitation frequencies. To clarify, a tuning technique may be used to induce maximum tensile deformations in the respective piezoelectric materials over a wide range of excitation frequencies. Different arrangements of strips of meta-substrate (coupled to piezoelectric elements) in various lengths may be set up to harness ambient vibration in a broad input frequency range, thereby providing a multi-frequency cantilevered MPEH array. As the device vibrates over a range of input frequencies, more than one member resonates or is close to resonance. Such arrangements enable multiple members to work in conjunction to create power concurrently. It is possible to create booster or cantilever beams of different sizes in dependence on the vibrational modal frequencies to be harnessed for a particular application.

Figure 16:
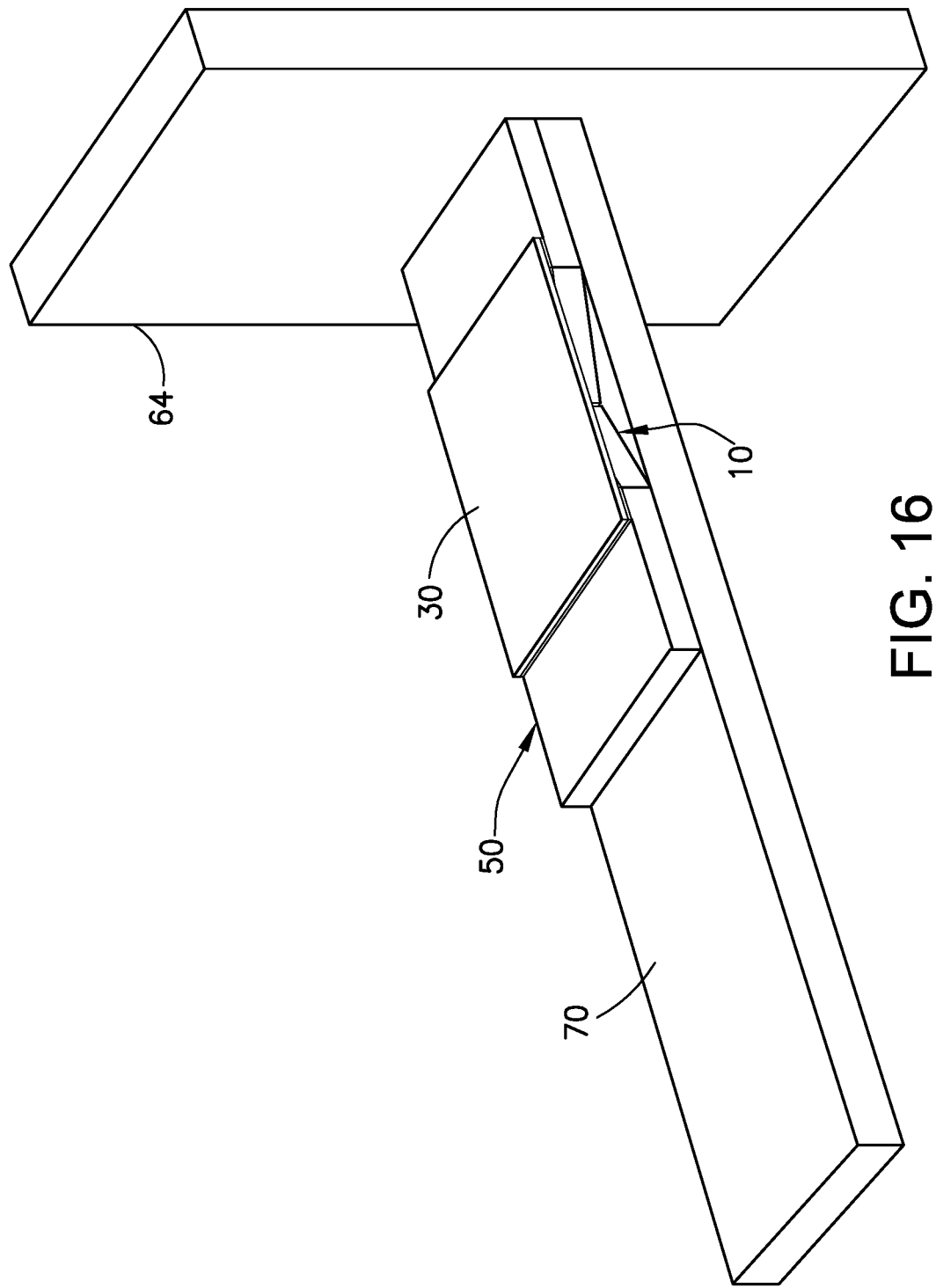
FIG. 16 is a diagram representing a 3-D view of a piezoelectric energy harvester having a meta-substrate booster attached to a host structure in the form of a cantilever beam.

In accordance with alternative embodiments, a meta-substrate 50 may be used as a booster which is bonded to a host structure in the form of a cantilever beam 70 made of material having positive Poisson's ratio, as depicted in FIG. 16. This booster can be utilized in situations where a cantilever beam has already been installed on a host structure 64 and substituting a cantilevered MPEH is either impracticable or suboptimal. In this situation, one may install the booster on the installed cantilever beam 70, and then the piezoelectric element 30 is attached on top of the meta-substrate cell 10. The booster generates more power (by up to a factor of 10) as compared to a conventional cantilevered PEH with a plain substrate or even without any substrate between the cantilever beam and piezoelectric element.

To validate the physical interpretation represented by Eq. (7), first finite element modeling was performed for a 3-D MPEH 48 having the structure depicted in FIG. 10. The performance of the proposed MPEH was validated using two experimental results of a conventional PEH and an auxetic piezoelectric energy harvester (APEH). As a case study, to demonstrate the significant power enhancement of the MPEH, an equivalent conventional PEH using a plain substrate was also modeled. Then, to prove the validity of the MPEH output, both simulated models were evaluated relative to experimental results of the conventional PEH. For this performance evaluation, material properties and design parameters were selected similar to the experimental test. To this end, the excitation frequency, modulus of elasticity of the thin layer of elastic glue, and amplitude sinusoidal strains selected for the simulation matched the values adopted in the experimental test.

Figure 17:
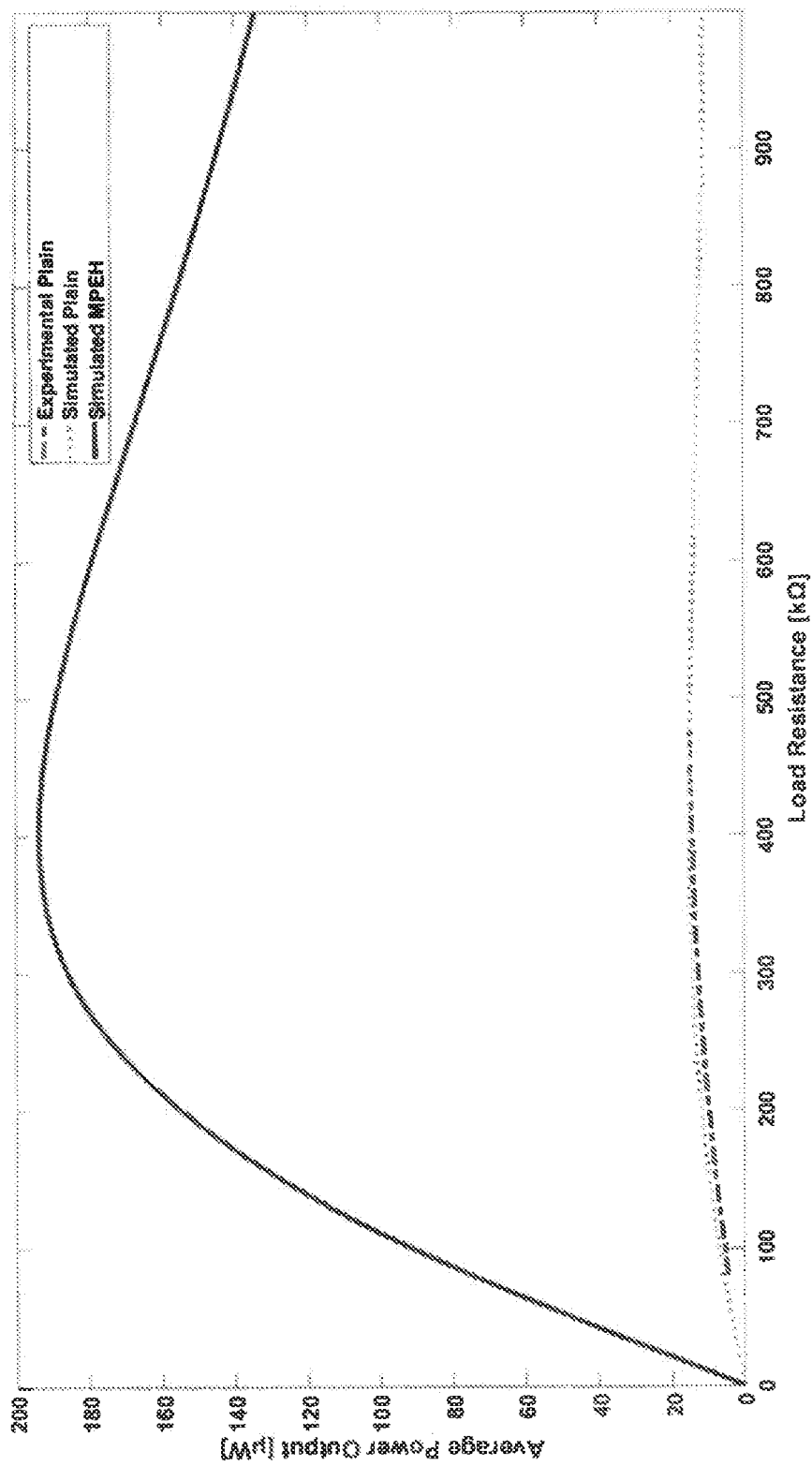
FIG. 17 is a graph of average power output versus load resistance derived from an experiment involving a plain-substrate piezoelectric energy harvester (dashed line), a simulation of a plain-substrate piezoelectric energy harvester (dotted line), and a simulation involving a meta-substrate piezoelectric energy harvester (solid line).

FIG. 17 is a graph of average power output versus load resistance derived from an experiment involving a plain-substrate piezoelectric energy harvester (dashed line), a simulation of a plain-substrate piezoelectric energy harvester (dotted line), and a simulation involving a meta-substrate piezoelectric energy harvester (solid line). As shown in FIG. 17, the average power output curve of the simulated model of a PEH with plain substrate was in a good agreement with the experimental results. At the electrical load resistance of 463 kΩ, the simulated PEH had an average power output of (14.8 µW) at the corresponding electrical load resistance. In contrast, the maximum power output of the simulated MPEH was 193.8 µW, which demonstrated a significantly enhanced power output compared to the conventional PEH with plain substrate.

The MPEHs proposed herein can improve strain-induced vibration applications in structural health monitoring systems, internet-of-things systems, micro-electromechanical systems, wireless sensor networks, vibration energy harvesters, and other applications where energy efficiency is dependent on deformation performance. For the sake of illustration, a wireless sensor network configured to acquire sensor data representing the state of components and parts of an aircraft will now be described. This sensor network includes a set of self-powered sensor nodes installed at respective positions on the outside or inside the aircraft and a set of wireless routers capable of receiving sensor data in wireless signals transmitted by the set of self-powered sensor nodes. The wireless sensors may include, for example, wireless passenger control units, brake temperature sensors, tire pressure sensors, light control switches, duct overheat sensors, aircraft health monitoring sensor, cabin temperature sensors, flight test instrumentation, door sensors, hatch sensors, cabin monitoring sensors, and other suitable types of sensors. Further, the sensor network includes one or more gateways connected to an aircraft data processing system. The gateway is capable of receiving sensor data in the wireless signals from the wireless routers and transmitting the received data into the aircraft network data processing system. This aircraft data processing system may be a line replaceable unit, such as, for example, a central server module, an electronic flight bag, a cabin services system, an environmental control system, an in-flight electronic entertainment system, a navigation system, a flight controller, a collision avoidance system, or some other suitable system. Depending on the particular implementation, the gateway may be directly connected to the aircraft data processing system. In other advantageous embodiments, the gateway may send the information to the aircraft data processing system across a network on which the data processing system is located. The data gathered by the wireless sensors may then be used by an aircraft data processing system to perform various operations, such as maintaining cabin pressure, controlling control surfaces, and generating alerts.

Figure 18:
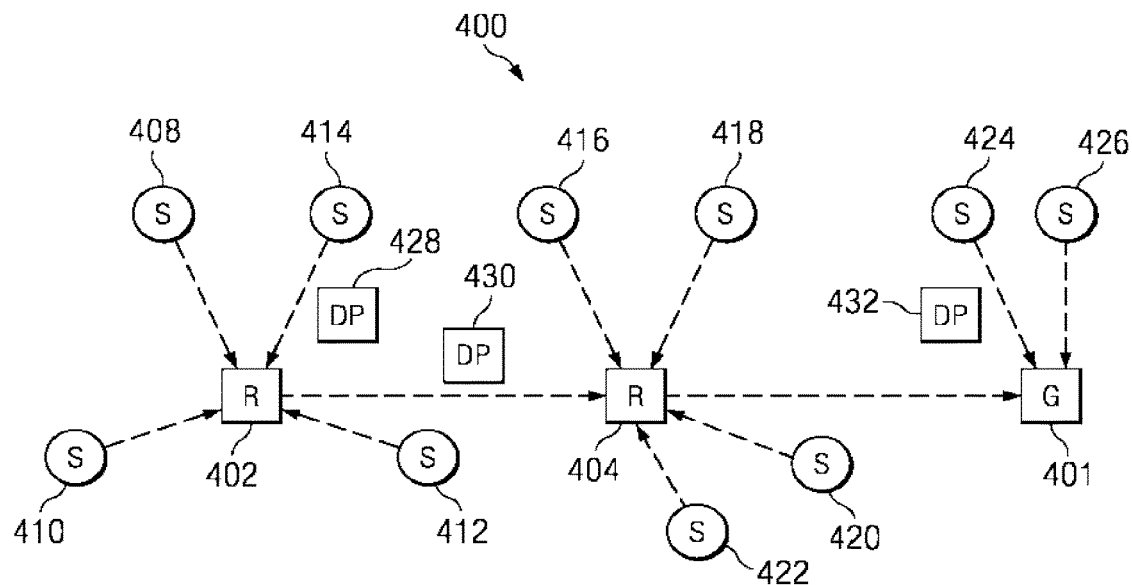
FIG. 18 is a diagram of a wireless sensor network in accordance with one embodiment.

FIG. 18 is a diagram of a wireless sensor network 400 in accordance with one embodiment. The wireless sensor network 400 includes a gateway 401, wireless routers 402 and wireless router 404, and self-powered wireless sensor nodes 408, 410, 412, 414, 416, 418, 420, 422, 424, and 426.

In the example depicted in FIG. 18, self-powered wireless sensor nodes 408, 410, 414, and 412 transmit wireless signals carrying sensor data to wireless router 402. In turn, wireless router 402 transmits signals containing the received data to wireless router 404. Wireless sensor nodes 416, 418, 420, and 422 transmit wireless signals carrying sensor to wireless router 404. Wireless router 404 sends this data in wireless signals to gateway 401. Further, wireless sensor nodes 424 and 426 directly send wireless signals to gateway 401. The different sensors may transmit data in the form of radiofrequency signals. In these examples, the data takes the form of data packets (DP), such as data packets 428, 430, and 432.

Further, gateway 406 may route the sensor data to the appropriate data processing system. In these examples, gateway 406 may also log data received from the sensor nodes with time stamps. Further, gateway 401 also may transmit an activity log to maintenance, operations, security, or other support personnel through an onboard or offboard system.

Wireless routers 402 and 404 may take various forms. For example, wireless routers 402 and 404 may be a computer that simply repeats data packets received from sensor nodes. In other advantageous embodiments, these routers may be a mesh network router, such as, for example, an XBee ZNet 2.5 RF Module, which is available from Digi International, Inc. Gateway 401 may be, for example, be implemented as a ConnectPort X8, which is available from Digi International, Inc.

Figure 19:
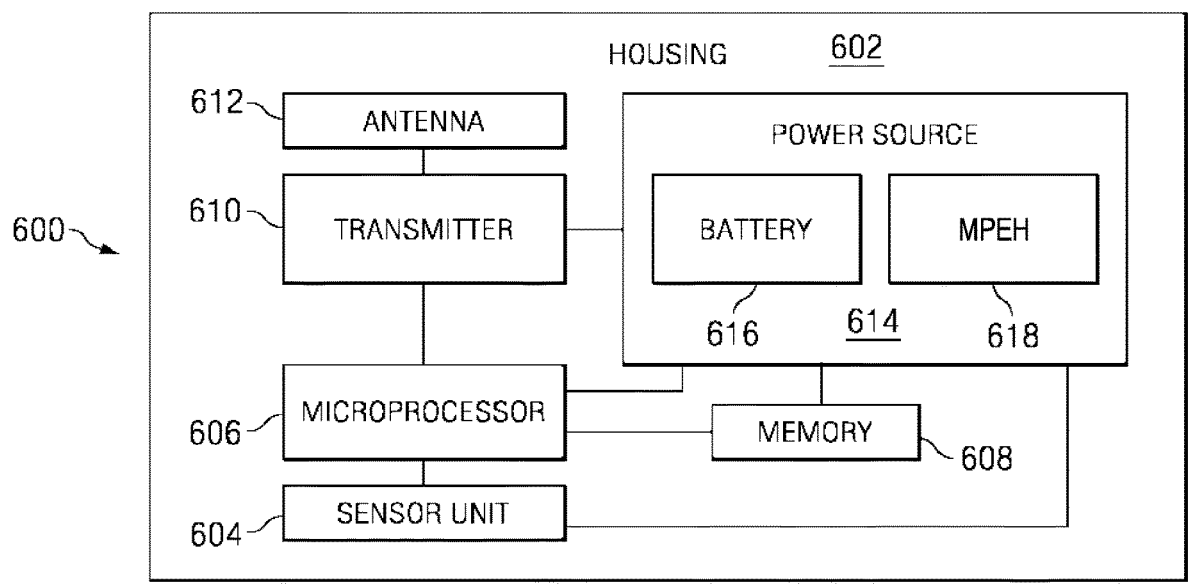
FIG. 19 is a block diagram of a self-powered sensor node in accordance with one embodiment.

FIG. 19 is a block diagram of a self-powered sensor node 600 in accordance with one embodiment. In this example, self-powered sensor node 600 includes a housing 602, which contains a sensor unit 604, a microprocessor 606, a memory 608, a transmitter 610, an antenna 612, and a power source 614. Sensor unit 604 may contain a set of sensors.

Data may be temporarily stored in memory 608 until transmitted by transmitter 610 over antenna 612. In this example, transmitter 610 transmits wireless signals over antenna 612 in the form of radiofrequency signals. Further, transmitter 610 is associated with a unique identification number that is included with a transmitted data packet to allow a gateway to distinguish between different sensor nodes and identify sensor locations. Microprocessor 606 controls the sampling or receipt of data from sensor unit 604. Microprocessor 606 may be configured to obtain and transmit data from sensor unit 604 based on an event. These events may be periodic or not periodic. The power source 614 provides power to transmitter 610, microprocessor 606, memory 608, and sensor unit 604 for the various operations.

In accordance with the proposed implementation depicted in FIG. 19, the power source 614 includes a battery 616 and an MPEH 618 of one of the types described above. The MPEH 618 may provide power when various conditions are present. The battery 616 may provide electric power to supplement or substitute for electric power provided by MPEH 618. Further, MPEH 618 may charge battery 616. In some applications, a capacitor or a super-capacitor may be used in lieu of battery 616 to provide power to the various components. This capacitor or super-capacitor may be used in conjunction with MPEH 618.

Figure 20:
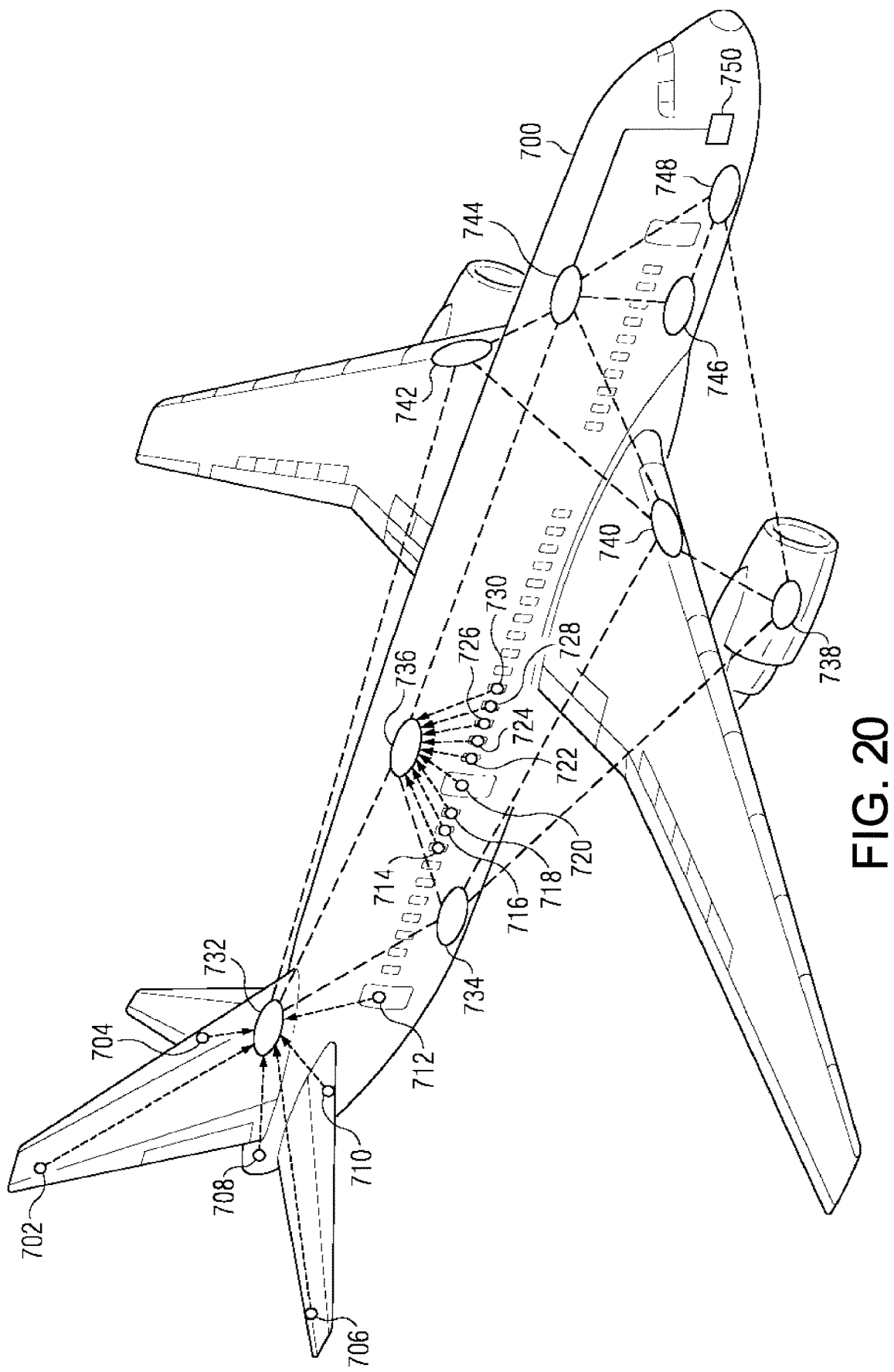
FIG. 20 is a diagram illustrating a wireless sensor network layout for an aircraft in accordance with one embodiment.

FIG. 20 is a diagram illustrating a wireless sensor network layout for an aircraft 700 in accordance with one embodiment. In this example, the aircraft 700 includes self-powered wireless sensor nodes 702, 704, 706, 708, 710, 712, 714, 716, 718, 720, 722, 724, 726, 728, and 730. The sensor network also includes wireless routers 732, 734, 736, 738, 740, 742, 744, 746, and 748. This sensor network also includes gateway 750. As depicted in FIG. 20, the different wireless sensors may be located inside and outside of the aircraft. Wireless sensor nodes 702, 704, 706, 708, 710, and 712 are located on the exterior of aircraft 700; wireless sensor nodes 714, 716, 718, 720, 722, 724, 726, 728, and 730 are located on the interior of the aircraft.

The wireless routers may be located on the interior or exterior of the aircraft depending on the particular implementation. In the example depicted in FIG. 20, wireless routers 732, 738, 740, 742 and 748 are located on the exterior of aircraft 700. Wireless routers 734, 736, 744, and 746 are located inside the aircraft. Also, in these examples, gateway 750 is located inside the aircraft 700. Interior locations may include, for example, passenger cabin, cabin ceiling areas, cargo holds, and electrical equipment centers. Exterior locations may include, for example, landing gear wheel wells, engine struts, and within the empennage. Also, both wireless and wired connections may be provided from a router sending data directly to gateway 750. Multiple routers may send data to gateway 750 to provide redundancy.

Figure 21:
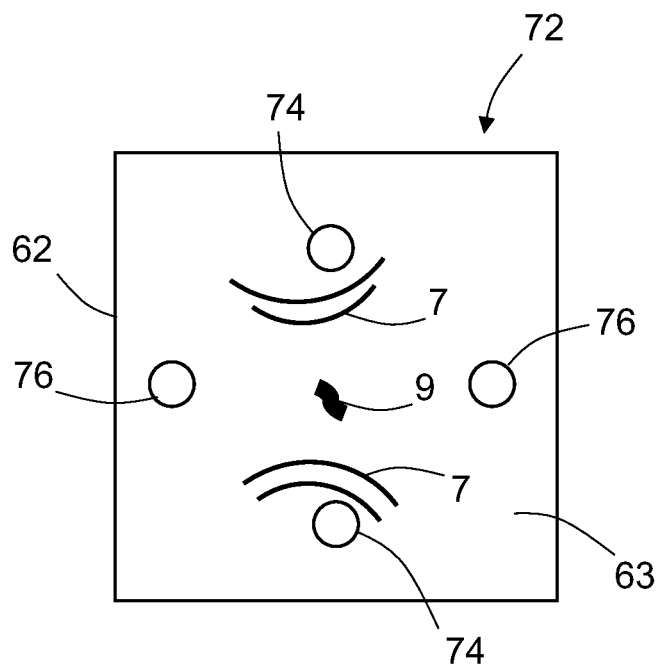
FIG. 21 is a diagram representing a top view of a portion of the surface of a host structure equipped with components of an active self-powered sensor node of a SHM system.

FIG. 21 is a diagram representing a top view of a portion of the surface 63 of a host structure 62 equipped with components of an active self-powered sensor node 72 of a SHM system (other components of the SHM system are not shown). In the example implementation depicted in FIG. 21, the active self-powered sensor node 72 includes a pair of actuators 74 and a pair of sensors 76. The actuators 74 are configured to transmit guided waves 7 which propagate in the host structure 62, which may, for example, be a laminated structure made of fiber-reinforced plastic material. The sensors 76 are configured to sense impinging guided waves 7. The actuators 74 and sensors 76 depicted in FIG. 21 are arranged to monitor an area of host structure 62 disposed between actuators 74 and between sensors 76.

FIG. 21 depicts a scenario in which the monitored area includes an anomaly 9. Guided waves 7 interact with anomaly 9, undergoing changes in amplitude which are sensed by sensors 76. Subsequent processing of sensor data transmitted by sensors 76 to a data processor (not shown in FIG. 21) and displaying the processed data on a display screen may reveal the existence of the anomaly 9.

In accordance with embodiments disclosed in some detail below, any actuator 74 and/or any sensor 76 may include a printed wiring board (PWB) and a multi-functional patch connected to the PWB. The PWB may be configured to use the patch for SHM in addition to energy harvesting. In some embodiments, each actuator 74 and each sensor 76 includes a meta-substrate of the type depicted in FIG. 2 and a piezoelectric element of the type depicted in FIG. 3. The meta-substrate is adhered to the surface 63 of the host structure 62; the piezoelectric element is glued to the meta-substrate. Each piezoelectric element may be used to convert structural vibrations into electric power. The electric energy may be sent to a local power management module on a printed wiring board (PWB) that is a component of the sensor node. The PWB (not shown in FIG. 21) also includes a microcontroller and a transceiver. In accordance with one proposed implementation, a single PWB may be electrically connected by wires to actuators 74 and sensors 76. In accordance with another proposed implementation, actuators 74 are electrically connected to one PWB, while sensors 76 are electrically connected to another PWB. In accordance with a further proposed implementation, a respective PWB may be electrically connected to each actuator 74 and each sensor 76.

Figure 22:
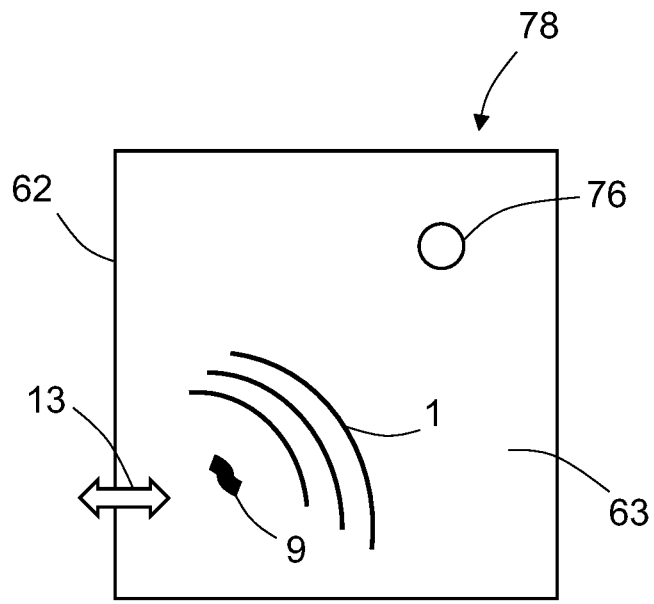
FIG. 22 is a diagram representing a top view of a portion of the surface of a host structure equipped with components of a passive self-powered sensor node of a SHM system.

FIG. 22 is a diagram representing a top view of a portion of the surface 63 of a host structure 62 equipped with a passive self-powered sensor node 78 of a SHM system (other components of the SHM system are not shown). In the example implementation depicted in FIG. 22, the passive self-powered sensor node 78 includes a sensor 76. The sensor 76 is configured to sense impinging mechanical waves 1 generated by ambient vibrations generated by an oscillating mechanical load 13 (indicated by a double-headed arrow in FIG. 22).

FIG. 22 depicts a scenario in which the monitored area includes an anomaly 9. The mechanical waves 1 interact with anomaly 9, undergoing changes in amplitude which are sensed by sensor 76. Subsequent processing of sensor data transmitted by sensor 76 to a data processor (not shown in FIG. 22) and displaying the processed data on a display screen may reveal the existence of the anomaly 9.

In accordance with embodiments disclosed in some detail below, the sensor 76 includes a meta-substrate of the type depicted in FIG. 2 and a piezoelectric element of the type depicted in FIG. 3. In addition to sensing, the piezoelectric element of sensor 76 may be used to convert structural vibrations into electric power. The electric energy may be sent to a local power management module on a PWB. The sensor data is also sent to the PWB for processing.

Figure 23:
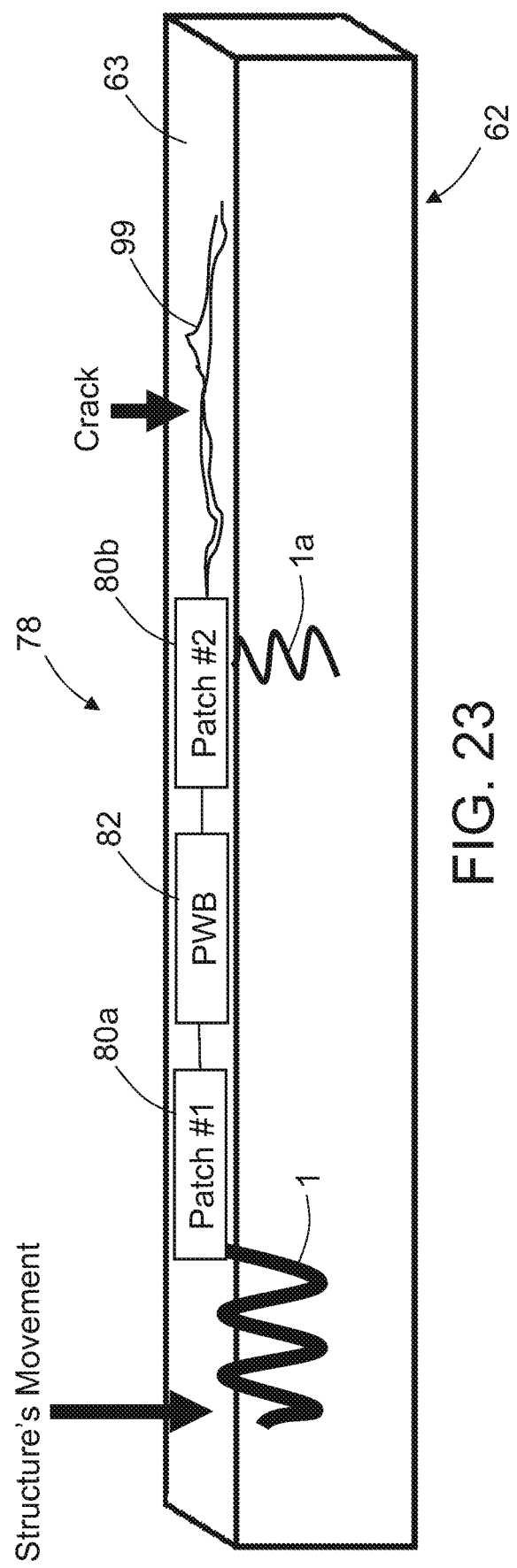
FIG. 23 is a diagram representing a 3-D view of a host structure being monitored by a passive self-powered sensor node comprising a printed wiring board (PWB) connected to a pair of piezoelectric transducers applied as patches on the host structure surface.

FIG. 23 is a diagram representing a 3-D view of an installed passive self-powered sensor node 78 in the process of monitoring the health of a host structure 62 in accordance with one embodiment. The self-powered sensor node 78 comprises a PWB 82 and a pair of patches 80*a* and 80*b* attached (e.g., glued or fastened) to the surface 63 of host structure 62. Each of patches 80*a* and 80*b* comprises a meta-substrate adhered to surface 63 and a piezoelectric element glued to the meta-substrate as previously described. The piezoelectric elements of patches 80*a* and 80*b* are electrically connected to PWB 82 by respective pairs of wires (e.g., electrical conductors having jackets made of electrically insulating material).

In the scenario depicted in FIG. 23, the piezoelectric element of patch 80*a* converts mechanical waves 1 (produced by ambient vibrations in the host structure 62) into electrical energy (electric power) which is supplied to the PWB 82. The PWB 82 is configured to receive, store, and use the electric power harvested by patch 80*a*. The piezoelectric element of patch 80*b* converts mechanical waves 1 which have interacted with an anomaly (e.g., crack 99) into electrical signals which are output to a microcontroller of PWB 82 for signal processing, data collection, and data transmission. The microcontroller is powered by the power management module. The electrical signals output by patch 80*b* are converted to digital sensor data which is recorded and then transmitted to a data processing center for analysis. For example, a technician may determine whether the sensor data indicates an anomaly in the host structure 62.

The microcontroller, transceiver, and other electrical circuitry of PWB 82 use the electric power generated by patch 80*a* to operate. In other words, the power provided by patch 80*a* is used by the microcontroller to acquire sensor data from patch 80*b*. The presence of the meta-substrate disclosed herein (consisting of one or more cells having an auxetic frame with two kirigami cuts) between the piezoelectric element of patch 80*a* and host structure 62 increases the amount of power produced by patch 80*a* Similarly, the presence of a similar meta-substrate between the piezoelectric element of patch 80*b* and host structure 62 increases the sensitivity of patch 80*b*.

Figure 24:
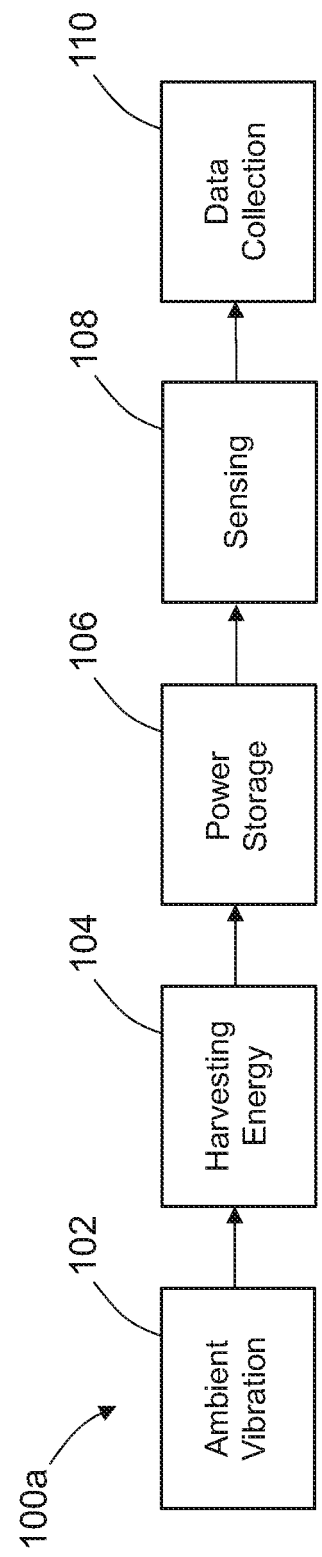
FIG. 24 is a flowchart identifying steps of a self-powered sensing process which may be performed using the components depicted in FIG. 23.

FIG. 24 is a flowchart identifying steps of a self-powered sensing process 100*a* which may be performed using the components depicted in FIG. 23. Mechanical waves are produced by ambient vibration 102 in the host structure 82. Any mechanical waves which impinge on the piezoelectric element of patch 80*a* are transduced into electrical energy (step 104). That harvested electrical power is stored by the PWB 82 (step 106). The stored energy is supplied to the microcontroller of PWB 82 as needed to process sensor data.

Impinging mechanical waves produced by ambient vibration 102 in host structure 62 are also transduced into electrical energy by the piezoelectric element of patch 80*b*. The microcontroller of the PWB 82 is configured to operate in a sensing mode in which the electrical current output by patch 80*b* is selectively received for short periods of time (step 108). The received signals are converted to digital sensor data onboard the PWB. The digital sensor data is collected (recorded) by the microcontroller in a non-transitory tangible computer-readable storage medium (step 110).

Figure 25:
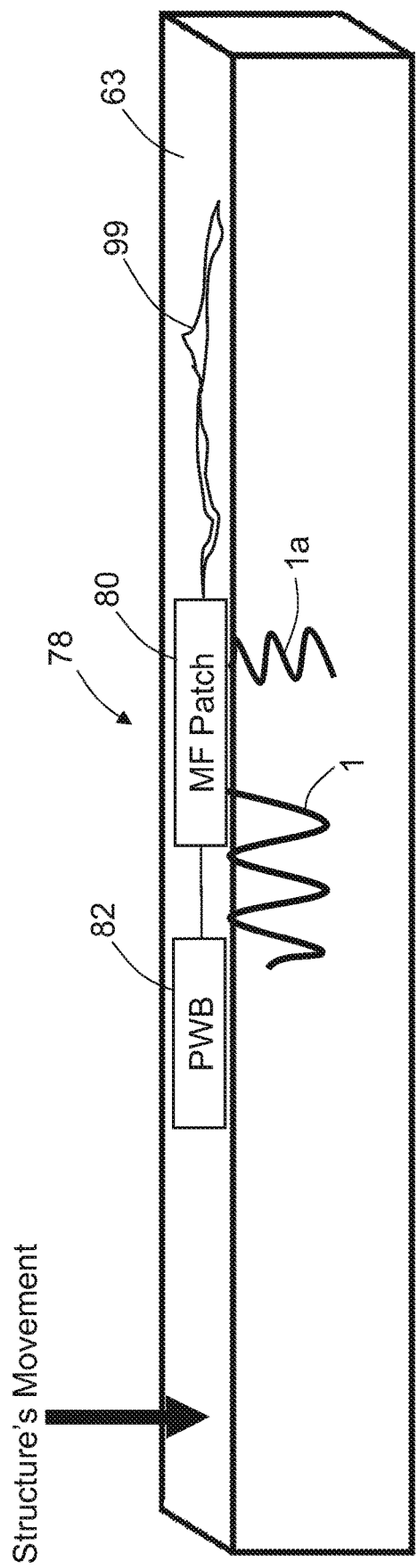
FIG. 25 is a diagram representing a 3-D view of a host structure being monitored by a passive self-powered sensor node comprising a PWB connected to a piezoelectric transducer applied as a patch on the host structure surface.

FIG. 25 is a diagram representing a 3-D view of a host structure 62 being monitored by a passive self-powered sensor node 78 comprising a PWB 82 connected (by electrical wires) to a piezoelectric transducer applied as a patch 80 on the surface 63 of host structure 62. The patch 80 is a passive device comprising a meta-substrate adhered to surface 63 and a piezoelectric element glued to the meta-substrate as previously described. Although the patch 80 in reality performs only a transducing function, the patch 80 effectively performs an energy harvesting function and/or a mechanical wave sensing function depending on how the electric charge transduced by its piezoelectric element is utilized by the PWB 82. In this sense, the patch 80 may be considered to be a "multifunctional (MF) patch", as indicated in FIG. 25.

In the scenario depicted in FIG. 25, the piezoelectric element of patch 80 converts mechanical waves 1 produced by the host structure's movement into electrical energy (electric power) which is supplied to the PWB 82. The PWB 82 is configured to receive, store, and use the electric power generated by patch 80. In addition, the piezoelectric element of patch 80 converts impinging mechanical waves 1\* which have interacted with an anomaly (e.g., crack 99) into electrical signals which are output to a microcontroller of the PWB 82 for signal processing, data collection, and data transmission. The microcontroller is powered by the power management module. The electrical signals output by patch 80 have a waveform which is changed by interaction with anomalies. Such waveform changes are converted into digital sensor data by the microcontroller. The collected sensor data may be transmitted to a data processing center to determine whether the sensor data includes any indication of the presence of an anomaly (e.g., crack 99) within the detection range of patch 80.

Figure 26:
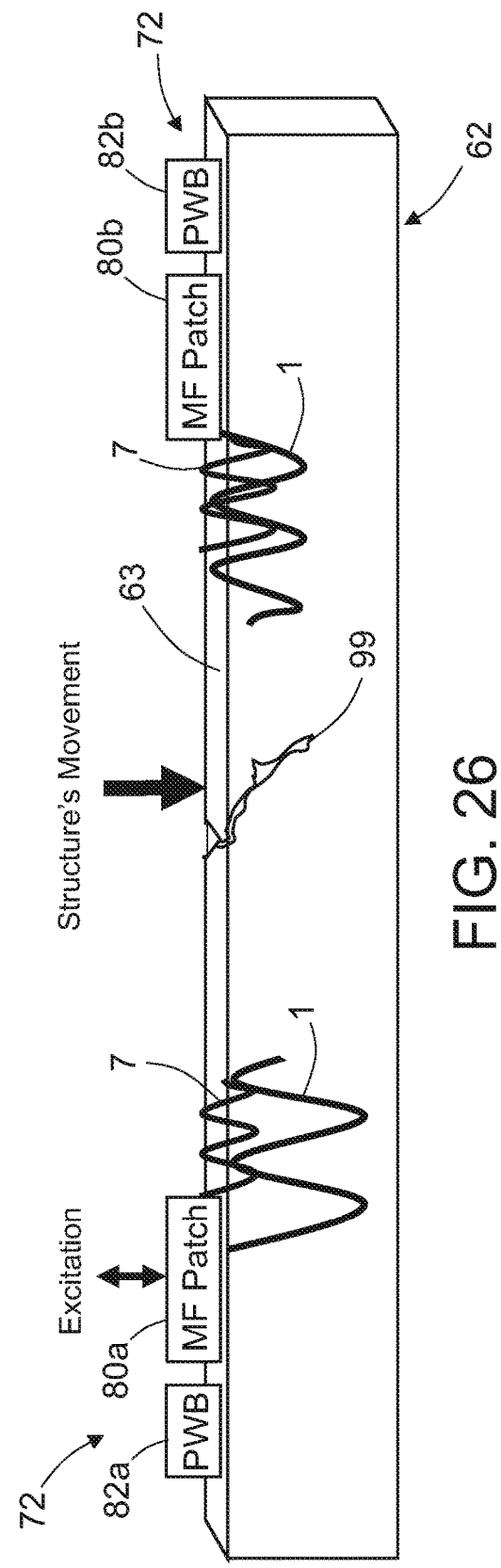
FIG. 26 is a diagram representing a 3-D view of a host structure being monitored by an active self-powered sensor node comprising a pair of piezoelectric transducers applied as respective patches on the host structure surface.

FIG. 26 is a diagram representing a 3-D view of a host structure 62 being monitored by an active self-powered sensor node 72 comprising a pair of PWBs 82*a* and 82*b* and a pair of piezoelectric transducers applied as respective patches 80*a* and 80*b* on the host structure surface. The piezoelectric transducer of patch 80*a* is connected to PWB 82*a*; the piezoelectric transducer of patch 80*b* is connected to PWB 82*b*. In the alternative, a single PWB may be connected to both patches 82*a* and 82*b*.

In the example depicted in FIG. 26, the microcontroller controlling patch 80*a* is configured to operate using electric energy harvested from mechanical waves 1 by patch 80*a* and then selectively energize the patch 80*a* to generate guided waves 7 (e.g., using sinusoidal excitation). Conversely, the microcontroller controlling patch 80*b* is configured to operate using electric energy harvested by patch 80*b* and also selectively receive an electrical signal from patch 80*b* when impinging guided waves 7 are transduced. The electrical signal output by patch 80*a* may have a waveform which deviates from the waveform of the excitation signal generated by the microcontroller controlling patch 80*a*. To the extent that the sensed guided waves 7 have been changed by interaction with crack 99, the sensor data acquired by active self-powered sensor node 72 may indicate the crack's presence.

Figure 27:
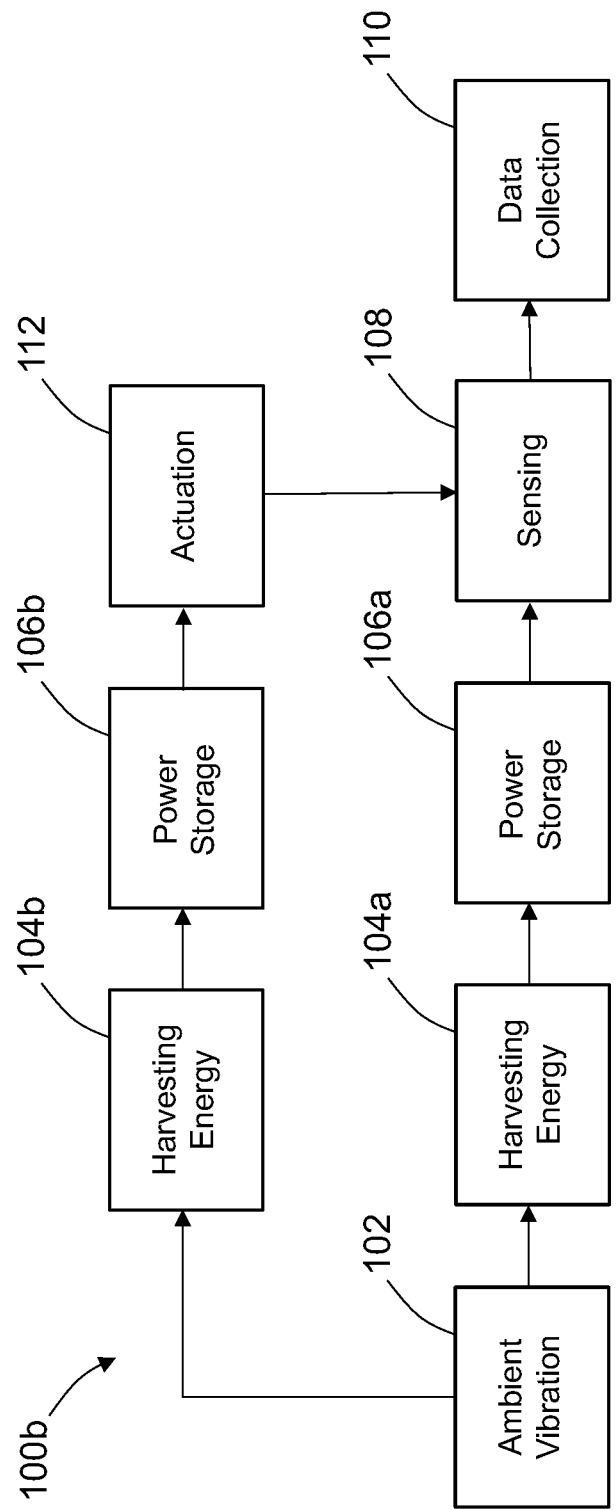
FIG. 27 is a flowchart identifying steps of an active self-powered SHM process performed by the sensor node depicted in FIG. 26.

FIG. 27 is a flowchart identifying steps of a self-powered sensing process 100*b* which may be performed using the components depicted in FIG. 26. The movements of host structure 62 produce ambient vibration 102. Impinging mechanical waves produced by movement of host structure 62 are transduced into electrical energy by the piezoelectric element of patch 80*a* (step 104*a*) and by the piezoelectric element of patch 80*b* (step 104*b*). The electric power transduced by patch 80*a* is stored by the associated PWB (step 106*a*). Similarly, the electric power transduced by patch 80*b* is stored by the associated PWB (step 106*b*). The stored energy is supplied to respective microcontrollers as needed to process sensor data.

One PWB has a microcontroller which is configured to generate an excitation signal which is input to actuate the piezoelectric element of patch 80*a* (step 112). The resulting guided waves 7 propagate across an area that contains an anomaly (e.g., crack 99). After interacting with the anomaly, the guided waves 7 impinge on and are sensed by the piezoelectric element of patch 80*b* (step 108). The other PWB has a microcontroller which is configured to operate in a sensing mode in which the electrical current output by patch 80*b* is selectively received for short periods of time (step 108). The received signals are converted to digital sensor data onboard the PWB. The digital sensor data is collected (recorded) by the microcontroller in a non-transitory tangible computer-readable storage medium (step 110).

Figure 28:
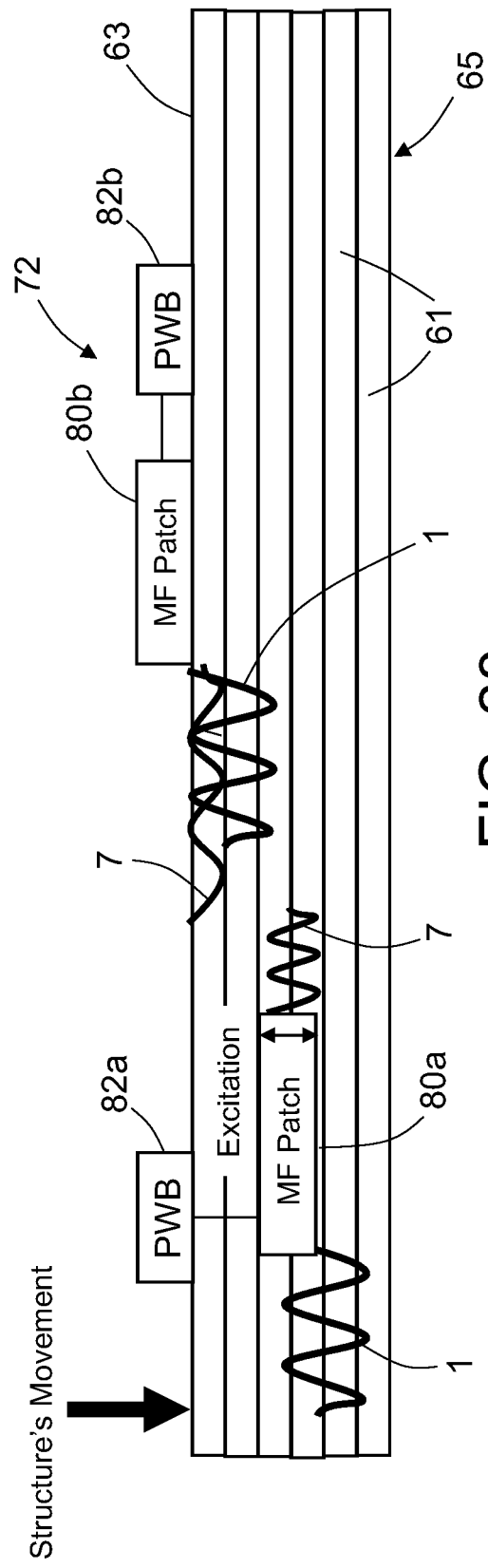
FIG. 28 is a diagram representing a side view of a composite laminate being monitored by an active self-powered sensor node comprising one piezoelectric patch applied on the surface of the laminate and another piezoelectric patch embedded between plies of the laminate.

FIG. 28 is a diagram representing a side view of a composite laminate 65 being monitored by an active self-powered sensor node 72 comprising one patch 80*b* for sensing applied on the surface of the laminate and another patch embedded 80*a* for actuation embedded between plies 61 of the composite laminate 65. The principle of operation is the same as the operational principle described for the node depicted in FIG. 26, the only difference being that in FIG. 26, patch 80*a* was disposed on the surface of the host structure, not embedded. The piezoelectric elements are connected to either a single PWB or respective PWBs 82*a* and 82*b* as shown in FIG. 28. In an implementation in which patches 80*a* and 80*b* are connected to respective microcontrollers, the microcontrollers may be configured to communicate wirelessly for the purpose of timing the reception of output from patch 80*b* for sensing to coincide (synchronize) with the excitation of patch 80*a* during actuation.

Figure 29:
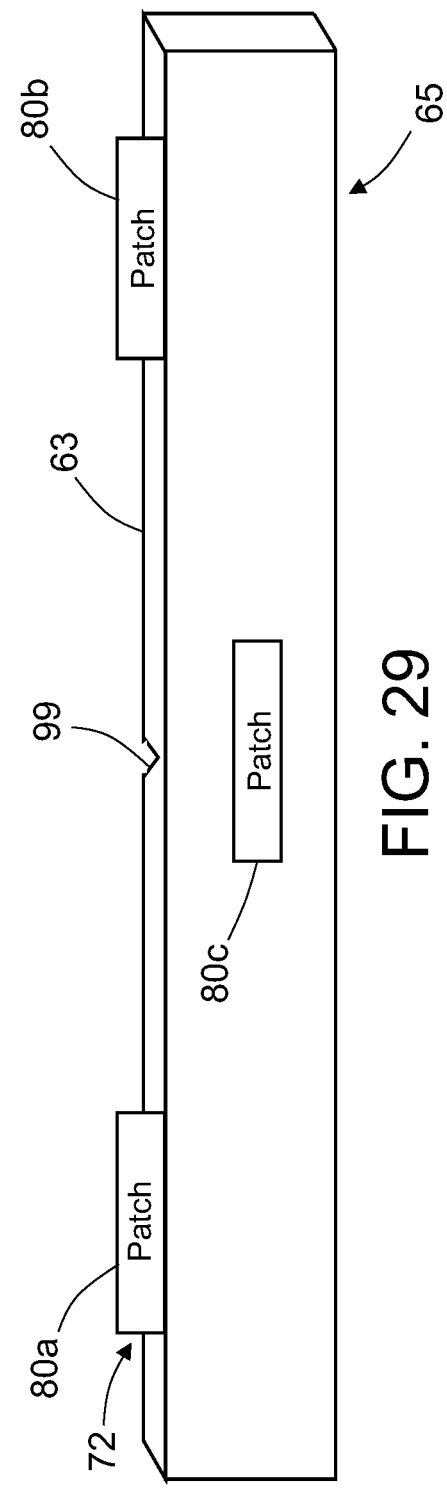
FIG. 29 is a diagram representing a 3-D view of a composite laminate being monitored by an active self-powered sensor node comprising a pair of piezoelectric transducer patches applied on the surface of the laminate and a third piezoelectric transducer patch embedded between plies of the laminate.

FIG. 29 is a diagram representing a 3-D view of a composite laminate 65 being monitored by an active self-powered sensor node comprising a first patch 80a applied on surface 63 of composite laminate 65, a second patch 80b applied on surface 63 of composite laminate 65, and a third patch 80c embedded between plies of the laminate. In accordance with one proposed implementation, the piezoelectric elements of patches 80a-80c may be connected to a single PWB attached to the surface 63 (not shown in FIG. 29). In this example, the embedded patch 80c is utilized to perform an energy harvesting function (providing power to the PWB); the surface-mounted patch 80a is utilized by the PWB to perform a guided wave actuation function; and the other surface-mounted patch 80b is used by the PWB to perform a guided wave sensing function.

Figure 30:
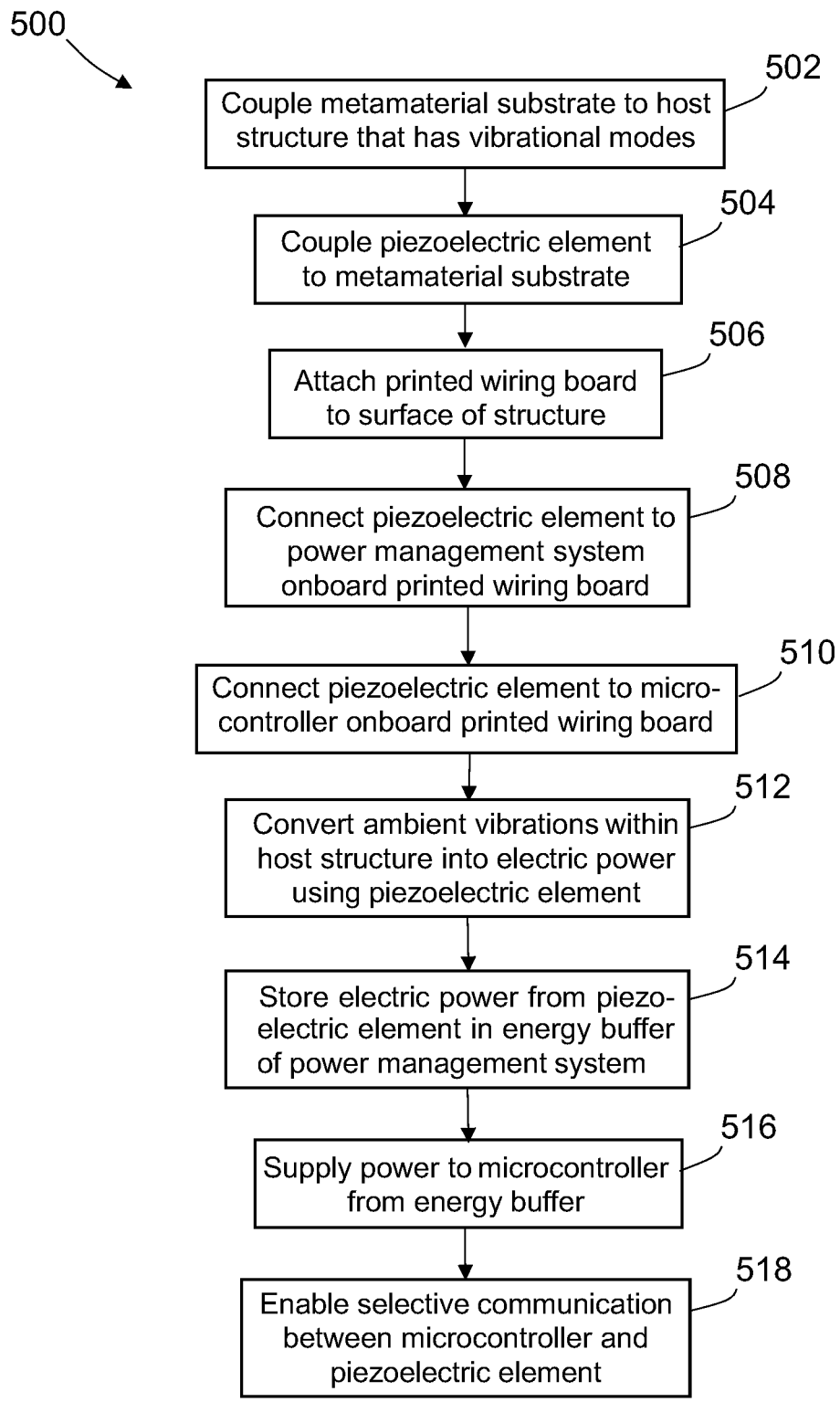
FIG. 30 is a flowchart identifying steps of a method for operating a sensor node attached to a host structure in accordance with one embodiment.

FIG. 30 is a flowchart identifying steps of a method 500 for operating a sensor node attached to a host structure that has vibrational modes in accordance with one embodiment. The sensor node is installed on the host structure by: coupling a metamaterial substrate to the host structure (step 502); coupling a piezoelectric element to the metamaterial substrate (step 504); attaching a printed wiring board to a surface of the host structure (step 506); connecting the piezoelectric element to a power management module onboard the printed wiring board (step 508); and connecting the piezoelectric element to a microcontroller onboard the printed wiring board (step 510). Following installation, the sensor node is ready for service. The sensor node converts ambient vibrations within the host structure into electric power using the piezoelectric element (step 512). The accumulated electric power from the piezoelectric element is stored in an energy buffer of the power management module (step 514). To enable operation of the microcontroller, power is supplied to the microcontroller from the energy buffer (step 516). Thereafter, selective communication between the microcontroller and the piezoelectric element is enabled (step 518).

Figure 31:
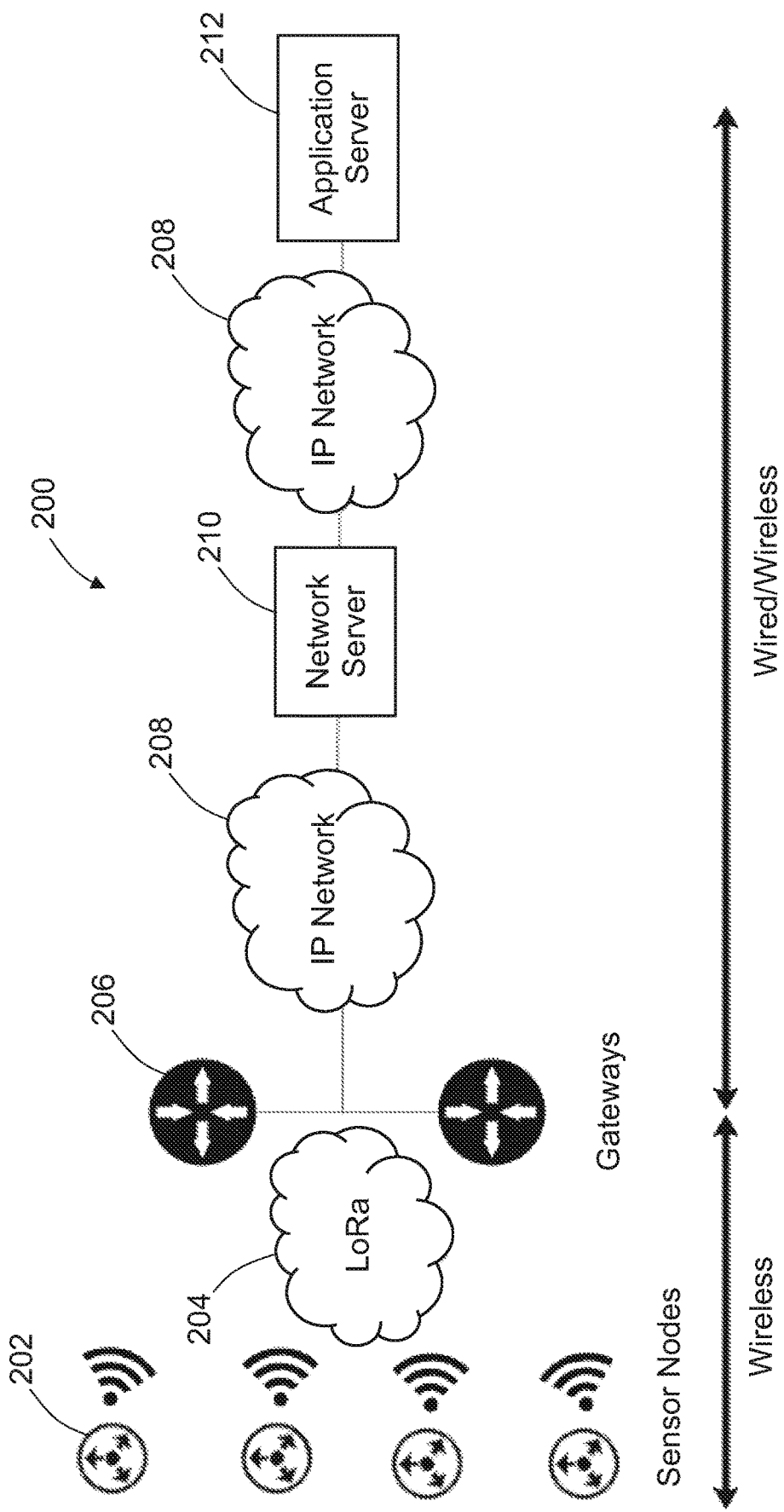
FIG. 31 is a block diagram identifying components of a SHM system configured as a wide area network in accordance with one embodiment. The sensor nodes may be of the types shown in FIGS. 23, 25, 26, 28, and 29.

FIG. 31 is a block diagram identifying components of a SHM system 200 configured as a wide area network in accordance with one embodiment. The sensor nodes 202 may be of one of the types shown in FIGS. 23, 25, 26, 28, and 29. The sensor nodes 202 communicate with a plurality of gateways 206 by means of a Long Range (LoRa) network that uses a spread spectrum modulation technique derived from chirp spread spectrum technology to transfer the sensor data in a low-power manner. The gateways 206 in turn communicate with a network server 210 via an Internet Protocol (IP) network 208. The network server 210 communicates with an application server 212 via IP network 208. The application server 212 may be configured to analyze the sensor collected by sensor nodes 202.

The MPEHs disclosed herein generate power at low excitation frequency and generate more power at high excitation frequency. This enables the microprocessor of the sensor node 202 to make real-time decisions in emergency cases (due to its enhancement in power generation). The sensor nodes 202 may be installed on aircraft wings and stabilizers or any other part of aircraft which is subject to vibration and needs to be monitored either during or after a flight. An operator onboard the aircraft can monitor the sensor data using the application server 212. The network server 210 manages the network, filters redundant data packets, performs security checks, and implements an adaptive data rate. The network server 210 transmits the data packets to the application server 212 to handle the customer application.

Figure 32:
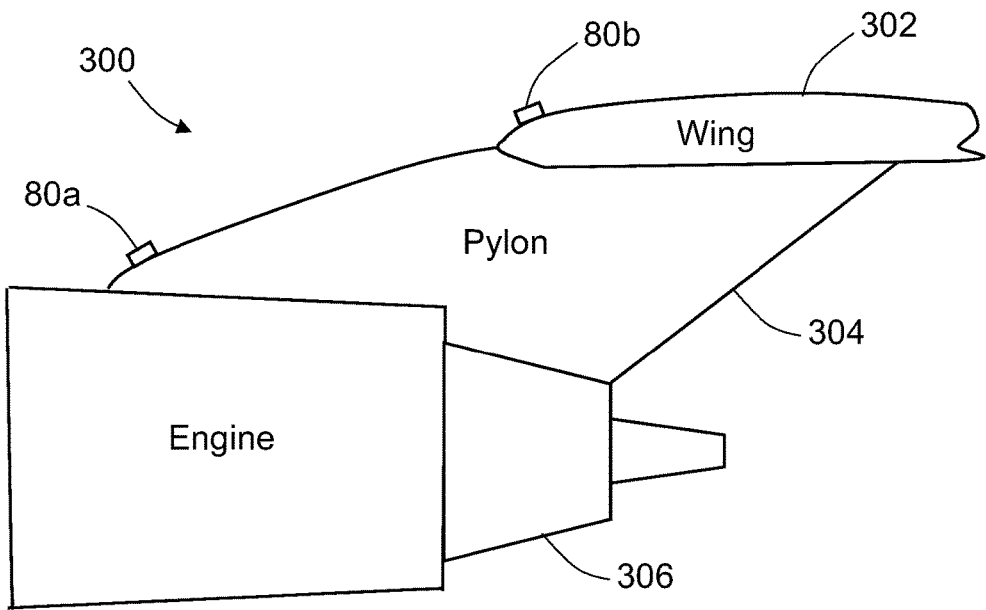
FIG. 32 is a side view showing a wing-mounted engine of an aircraft having a piezoelectric transducer patches vibrationally coupled to the pylon and the wing respectively in accordance with one proposed implementation.
Figure 33:
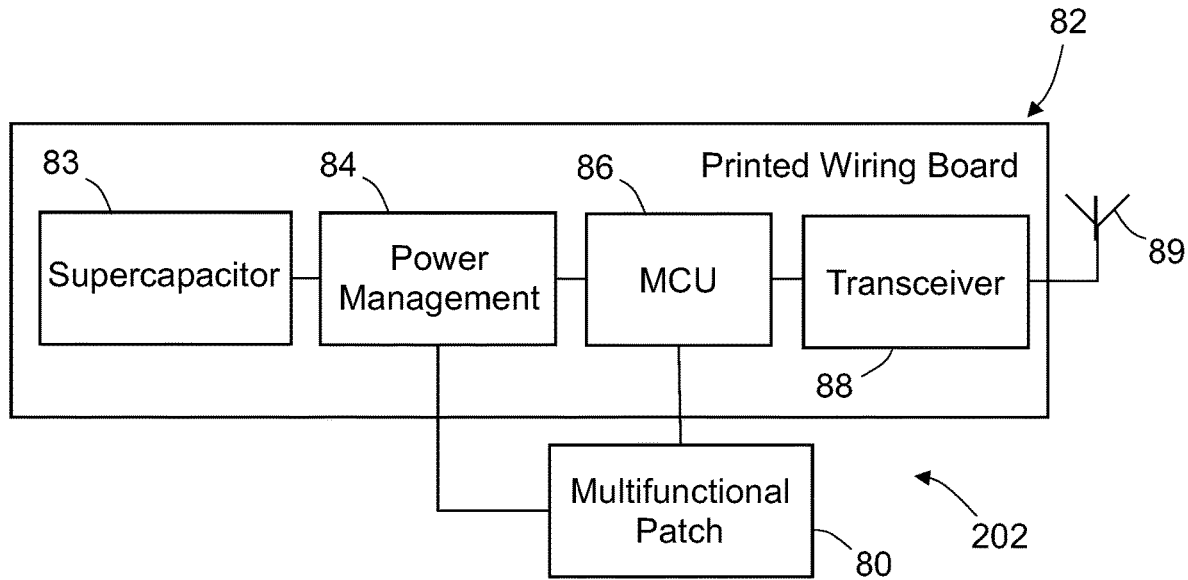
FIG. 33 is a block diagram identifying components of a self-powered sensor node in accordance with one proposed implementation.

FIG. 32 is a side view showing an engine 306 which is mounted to a wing 302 of an aircraft 300. One patch 80a is attached to the pylon 304 near the engine 306 (where vibrations are high due to rotation of the turbine) for the purpose of harvesting vibrational energy. Another patch 80b is attached to the wing 302 in an area near the leading edge for the purpose of SHM. A PWB (not shown) may be mounted to the wing 302 or pylon 304. The PWB receives electric energy from patch 80a and then uses that energy to collect sensor data from patch 80b FIG. 33 is a block diagram identifying components of a self-powered sensor node 202 in accordance with one proposed implementation. The self-powered sensor node 202 includes a PWB 82, an external antenna 89, and a patch 80. The external antenna 89 and patch 80 are connected to PWB 82 by wires. The PWB 82 includes a supercapacitor 83, a power management module 84 connected to supercapacitor 72, a microcontroller unit 86 connected to power management module 84, and a transceiver 88 connected to microcontroller unit 86 and to antenna 89. The power management module 84 is configured to provide connected to supercapacitor 72.

Still referring to FIG. 33, the patch 80 is connected by wires to power management module 84 and to microcontroller unit 86. The power management module 84 is configured to continuously receive harvested energy from patch 80 and store received energy in supercapacitor 83 as well as in an energy buffer (e.g., a capacitor) incorporated inside power management module 84. The microcontroller unit 86 is configured to continuously receive electric power from power management module 84 and selectively communicate with patch 80 on an intermittent or periodic basis. In the case wherein patch 80 is being used as an actuator, the microcontroller unit 86 selectively energizes the patch 80 to generate guided waves. In the case wherein patch 80 is being used as a sensor, the microcontroller unit 86 selectively receives an electrical signal from patch 80.

The patch 80 includes a metamaterial substrate and a piezoelectric element adhered to the metamaterial substrate. The piezoelectric element is connected to the power management module 84 and to the microcontroller unit 86. The microcontroller unit 86 is configured to selectively convert electrical signals received from the piezoelectric element into sensor data and then command the transceiver 88 to transmit the sensor data via the antenna 89.

In accordance with one proposed implementation, the power management module 84 is configured to rectify the current drawn from supercapacitor 626 and then store the DC power in a capacitor that supplies DC power to the microcontroller unit 86. Charging the capacitor stores energy in the electric field between the capacitor plates. The energy may be discharged when a pre-set threshold is reached.

While SHM systems having self-powered sensor nodes with meta-substrate-based piezoelectric transducers have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore, it is intended that the claims not be limited to the particular embodiments disclosed herein.

As used herein and in the claims, the term "connected", when used in the context of electrical circuits, means connected by electrical conductors capable of carrying electrical signals when the electrical circuits are energized.

The invention claimed is:
1. A self-powered sensor node comprising:
a printed wiring board comprising a microcontroller, a transceiver connected to communicate with the microcontroller, an antenna connected to the transceiver, and a power management module connected to supply electric power to the microcontroller; and
a first patch comprising a first metamaterial substrate and a first piezoelectric element adhered to the first metamaterial substrate, wherein:
the first piezoelectric element is connected to the power management module and to the microcontroller;
the power management module is configured to store electric power received from the first piezoelectric element;
the microcontroller is configured to selectively convert electrical signals received from the first piezoelectric element into sensor data and then command the transceiver to transmit the sensor data via the antenna;
the first metamaterial substrate comprises a cell;
the cell comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form a first cut when the first flexible structure is in an unflexed state and are connected to each other by a fifth flexural hinge that closes a closed end of the first cut; and
the third and fourth flexural elements form a second cut when the second flexible structure is in an unflexed state and are connected to each other by a sixth flexural hinge that closes a closed end of the second cut.

2. The self-powered sensor node as recited in claim 1, further comprising a second patch comprising a second metamaterial substrate and a second piezoelectric element adhered to the second metamaterial substrate, wherein:
the second piezoelectric element is connected to the power management module and to the microcontroller;
the power management module is further configured to store electric power received from the second piezoelectric element; and
the microcontroller is further configured to selectively send electrical signals to activate the second piezoelectric element prior to selectively converting electrical signals received from the first piezoelectric element into sensor data.

3. The self-powered sensor node as recited in claim 2, wherein at least one of the first and second metamaterial substrates has an auxetic kirigami honeycomb structure.

4. The self-powered sensor node as recited in claim 1, wherein the first and second cuts are uniaxial when the first and second flexible structures are in their unflexed states.

5. The self-powered sensor node as recited in claim 1, wherein the fifth and sixth flexural hinges are separated by a gap that increases in size as the first and second walls move away from each other.

6. The self-powered sensor node as recited in claim 5, wherein the gap is part of an opening having a concave polygonal shape defined by six straight line segments.

7. The self-powered sensor node as recited in claim 1, wherein the first through fourth flexural elements bend at the first through fourth flexural hinges respectively as the first and second walls move away from each other.

8. A self-powered sensor node comprising:
a printed wiring board comprising a microcontroller, a transceiver connected to communicate with the microcontroller, an antenna connected to the transceiver, and a power management module connected to supply electric power to the microcontroller; and
a first patch comprising a first metamaterial substrate and a first piezoelectric element adhered to the first metamaterial substrate, wherein:
the first piezoelectric element is connected to the power management module and to the microcontroller;
the power management module is configured to store electric power received from the first piezoelectric element; and
the microcontroller is configured to selectively convert electrical signals received from the first piezoelectric element into sensor data and then command the transceiver to transmit the sensor data via the antenna;
the first metamaterial substrate has an auxetic kirigami honeycomb structure;
the auxetic kirigami honeycomb structure comprises at least one auxetic cell comprising an auxetic frame having kirigami cuts and a negative Poisson's ratio; and
at least one auxetic cell of the first metamaterial substrate comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form a first cut when the first flexible structure is in an unflexed state and are connected to each other by a fifth flexural hinge that closes a closed end of the first cut; and
the third and fourth flexural elements form a second cut when the second flexible structure is in an unflexed state and are connected to each other by a sixth flexural hinge that closes a closed end of the second cut.

9. The self-powered sensor node as recited in claim 8, wherein the first and second cuts are uniaxial when the first and second flexible structures are in their unflexed states.

10. The self-powered sensor node as recited in claim 8, wherein the fifth and sixth flexural hinges are separated by a gap that increases in size as the first and second walls move away from each other.

11. The self-powered sensor node as recited in claim 10, wherein the gap is part of an opening having a concave polygonal shape defined by six straight line segments.

12. The self-powered sensor node as recited in claim 8, wherein the first through fourth flexural elements bend at the first through fourth flexural hinges respectively as the first and second walls move away from each other.

13. A self-powered sensor node comprising:
a printed wiring board comprising a microcontroller, a transceiver connected to communicate with the microcontroller, an antenna connected to the transceiver, and a power management module connected to supply electric power to the microcontroller;
a first patch comprising a first metamaterial substrate and a first piezoelectric element adhered to the first metamaterial substrate and connected to the power management module; and
a second patch comprising a second metamaterial substrate and a second piezoelectric element adhered to the second metamaterial substrate and connected to the microcontroller, wherein:
the power management module is configured to store electric power received from the first piezoelectric element; and
the microcontroller is configured to selectively convert electrical signals received from the second piezoelectric element into sensor data and then command the transceiver to transmit the sensor data via the antenna;
the first metamaterial substrate comprises a first cell and the second metamaterial substrate comprises a second cell;
each of the first and second cells comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form a first cut when the first flexible structure is in an unflexed state and are connected to each other by a fifth flexural hinge that closes a closed end of the first cut; and
the third and fourth flexural elements form a second cut when the second flexible structure is in an unflexed state and are connected to each other by a sixth flexural hinge that closes a closed end of the second cut.

14. The self-powered sensor node as recited in claim 13, further comprising a third patch comprising a third metamaterial substrate and a third piezoelectric element adhered to the third metamaterial substrate and connected to the microcontroller, wherein the microcontroller is further configured to selectively send electrical signals to activate the third piezoelectric element prior to selectively converting electrical signals received from the second piezoelectric element into sensor data.

15. The self-powered sensor node as recited in claim 13, wherein the first and second cuts are uniaxial when the first and second flexible structures are in their unflexed states.

16. The self-powered sensor node as recited in claim 13, wherein the fifth and sixth flexural hinges are separated by a gap that increases in size as the first and second walls move away from each other.

17. The self-powered sensor node as recited in claim 16, wherein the gap is part of an opening having a concave polygonal shape defined by six straight line segments.

18. The self-powered sensor node as recited in claim 13, wherein the first through fourth flexural elements bend at the first through fourth flexural hinges respectively as the first and second walls move away from each other.

19. A self-powered sensor node comprising:
a printed wiring board comprising a microcontroller, a transceiver connected to communicate with the microcontroller, an antenna connected to the transceiver, and a power management module connected to supply electric power to the microcontroller;
a first patch comprising a first metamaterial substrate and a first piezoelectric element adhered to the first metamaterial substrate and connected to the power management module; and
a second patch comprising a second metamaterial substrate and a second piezoelectric element adhered to the second metamaterial substrate and connected to the microcontroller, wherein:
the power management module is configured to store electric power received from the first piezoelectric element;
the microcontroller is configured to selectively convert electrical signals received from the second piezoelectric element into sensor data and then command the transceiver to transmit the sensor data via the antenna;
the first and second metamaterial substrates each have an auxetic kirigami honeycomb structure;
the auxetic kirigami honeycomb structure comprises at least one auxetic cell comprising an auxetic frame having kirigami cuts and a negative Poisson's ratio;
at least one auxetic cell of the first metamaterial substrate comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form a first cut when the first flexible structure is in an unflexed state and are connected to each other by a fifth flexural hinge that closes a closed end of the first cut; and
the third and fourth flexural elements form a second cut when the second flexible structure is in an unflexed state and are connected to each other by a sixth flexural hinge that closes a closed end of the second cut.

20. The self-powered sensor node as recited in claim 19, further comprising a third patch comprising a third metamaterial substrate and a third piezoelectric element adhered to the third metamaterial substrate and connected to the microcontroller, wherein the microcontroller is further configured to selectively send electrical signals to activate the third piezoelectric element prior to selectively converting electrical signals received from the second piezoelectric element into sensor data.

* * * * *